US012760798B2

(12) United States Patent
Matsumoto

(10) Patent No.: US 12,760,798 B2
(45) Date of Patent: Oct. 13, 2026

(54) GATE VALVE

(71) Applicant: Hirata Corporation, Kumamoto (JP)

(72) Inventor: Bungo Matsumoto, Kumamoto (JP)

(73) Assignee: HIRATA CORPORATION, Kumamoto (JP)

( * ) Notice: Subject to any disclaimer, the term of this patent is extended or adjusted under 35 U.S.C. 154(b) by 128 days.

(21) Appl. No.: 18/994,233

(22) PCT Filed: Aug. 30, 2023

(86) PCT No.: PCT/JP2023/031480
§ 371 (c)(1),
(2) Date: Jan. 14, 2025

(87) PCT Pub. No.: WO2024/053507
PCT Pub. Date: Mar. 14, 2024

(65) Prior Publication Data

US 2026/0251222 A1 Aug. 27, 2026

(30) Foreign Application Priority Data

Sep. 7, 2022 (JP) ................................. 2022-142444

(51) Int. Cl.
*F16K 3/18* (2006.01)
*F16K 3/02* (2006.01)
*H10P 72/00* (2026.01)

(52) U.S. Cl.
CPC ............ *F16K 3/182* (2013.01); *F16K 3/0218* (2013.01); *H10P 72/0466* (2026.01)

(58) Field of Classification Search
CPC ..... F16K 3/182; F16K 3/0218; H10P 72/0466
See application file for complete search history.

(56) References Cited

U.S. PATENT DOCUMENTS 1,578,695 A * 3/1926 Westrip ................. F16K 3/0218 251/193
2,096,420 A * 10/1937 Barr ........................ F16K 3/182 251/201

(Continued)

FOREIGN PATENT DOCUMENTS

WO 2000/075542 A1 12/2000
WO 2014/174926 A1 10/2014

OTHER PUBLICATIONS

International Search Report, mailed on Oct. 31, 2023, issued for the corresponding International Application No. PCT/JP2023/031480, 5 pages with English translation.

(Continued)

*Primary Examiner* — Patrick C Williams
(74) *Attorney, Agent, or Firm* — LUCAS & MERCANTI, LLP

(57) ABSTRACT

A gate valve includes: a moving body that integrally moves with the valve element; and a converting mechanism that moves the moving body in a perpendicular direction to the opening surface and an intersecting direction intersecting with the perpendicular direction. The converting mechanism includes: a first operation mechanism that moves in the intersecting direction and makes the moving body move in the intersecting direction, and a second operation mechanism that makes the moving body move in the perpendicular direction. An operation performed by the second operation mechanism includes an operation due to additional movement of the first operation mechanism to the intersecting direction from a state where the movement of the moving body in the intersecting direction is restricted.

10 Claims, 14 Drawing Sheets

(56) References Cited

U.S. PATENT DOCUMENTS

| | | | | | |
|---|---|---|---|---|---|
| 3,120,944 | A * | 2/1964 | Cogez | F16K 31/5286 | 251/329 |
| 3,602,481 | A * | 8/1971 | Martin | F16K 3/0218 | 251/203 |
| 4,453,699 | A * | 6/1984 | Hulsey | F16K 3/182 | 251/63.4 |
| 4,491,145 | A * | 1/1985 | Williams | F16K 3/182 | 251/169 |

OTHER PUBLICATIONS

Office Action, dated Jul. 15, 2024, issued for the corresponding Taiwan Patent Application No. 112133505, 9 pages, with English translation.

* cited by examiner

GATE VALVE

CROSS REFERENCE TO RELATED APPLICATION

This Application is a 371 of PCT/JP2023/031480 filed on Aug. 30, 2023, which, in turn, claims priority of Japanese Patent Application No. 2022-142444 filed on Sep. 7, 2022, and the above applications are incorporated herein by reference.

FIELD OF THE INVENTION

The present invention relates to a gate valve that seals an opening that communicates with a processing unit of a processing device that performs vacuum processing.

DESCRIPTION OF THE RELATED ART

Conventionally, with respect to a gate valve provided for sealing an opening that communicates with a processing device such as a chamber where electronic parts such as a semiconductor wafer and a liquid crystal printed circuit board and a load lock device, various type of gate valves have been proposed.

Among these gate valves, there has been known a gate valve where a valve element that opens or closes an opening of the valve is made to swing, and is hermetically brought into pressure contact with an opening surface in which the opening is formed at the time of closing the valve thus maintaining a hermetic state in the processing device.

For example, patent literature 1 discloses a gate valve having the following configuration. That is, the gate valve includes: a swing frame that has an intermediate portion thereof rotatably connected to a distal end of an arm that constitutes a link mechanism by way of a pivotally supporting point; and a valve element that is connected to an upper end portion of the swing frame. In such a gate valve, by swinging the swing frame by way of the pivotally supporting point, the valve element is allowed to perform an approaching operation and a separating operation with a predetermined displacement angle with respect to an opening peripheral surface that forms an opening surface of an opening that communicates with a processing unit.

PRIOR ART LITERATURE

Patent Literature

PTL1: International Publication No. WO 2000/075542

SUMMARY OF INVENTION

Technical Problem

However, according to the conventional gate valve described above, the valve element is made to move with a predetermined displacement angle with respect to the opening surface. Accordingly, a seal member that is attached to the valve element and is made of an elastic material such as rubber slides with respect to the opening surface. Further, due to the sliding of the seal member with respect to the opening surface, a shearing force in a direction parallel to the opening surface is generated in the seal member. With respect to a friction force or a shearing force generated in the seal member due to sliding at the time of closing the valve in this manner, there is a possibility that the friction force or the shearing force gives rise to the generation of particles and the degradation of the seal member (the degradation of the sealing performance).

It is an object of the present invention to provide a gate valve that can realize, without performing a swing operation of a valve element with respect to an opening surface where an opening that communicates with a processing unit, individual movements consisting of: an protruding and separating movement of the valve element to and from a position that faces the opening: and an approaching and spacing movement thus allowing a seal member that is disposed on a valve element to come into contact with the opening surface in a perpendicular direction whereby the generation of particles due to sliding and the degradation of the seal member due to a shearing force can be reduced.

Solution to Problem

To overcome the drawbacks described above, the present invention provides a gate valve configured to press a valve element that includes a seal member to an opening surface where an opening that communicates with a processing part of a processing device that performs processing in vacuum thus sealing the opening, the gate valve comprising: a moving body configured to move integrally with the valve element; a conversion mechanism configured to move the moving body in respective directions consisting of a perpendicular direction to the opening surface and an intersecting direction that intersects with the perpendicular direction; and a transmission mechanism configured to transmit power to the conversion mechanism from a drive source, wherein the conversion mechanism includes: a first operation mechanism configured to move in the intersecting direction so as to make the moving body move in the intersecting direction; and a second operation mechanism configured to make the moving body move in the perpendicular direction, and an operation performed by the second operation mechanism includes an operation due to additional movement of the first operation mechanism in the intersecting direction from a state where the movement of the moving body in the intersecting direction is restricted.

The present invention also provides a gate valve configured to press a valve element that includes a seal member to an opening surface where an opening that communicates with a processing part of a processing device that performs processing in vacuum thus sealing the opening, the gate valve comprising: a housing; a perpendicular moving body being held in the housing and being movable in a perpendicular direction to the opening surface; and a perpendicular operation mechanism disposed between the housing and the perpendicular moving body, the perpendicular moving body includes: a moving body configured to move integrally with the valve element; a lift body configured to move together with the moving body in an intersecting direction that intersects with the perpendicular direction; a drive source configured to make the lift body move in the intersecting direction, and a lift operation mechanism disposed between the lift body and the moving body, the lift body is configured to be movable in the intersecting direction between a first operation region where the lift body moves in the intersecting direction together with the moving body by way of the lift operation mechanism and a second operation region where, in a state where the movement of the moving body in the intersecting direction is restricted, the lift body is further moved in the intersecting direction by operating the perpendicular operation mechanism, and the perpendicular operation mechanism is configured, along with the movement of the lift body in the intersecting direction in the second operation region, to make the perpendicular moving body move in the perpendicular direction.

Advantageous Effects of Invention

According to the present invention, in the gate valve, the generation of particles and the deterioration of a seal member can be reduced.

DETAILED DESCRIPTION OF THE PREFERRED EMBODIMENTS

Hereinafter, an embodiment of a gate valve according to a present invention is described with reference to drawings.

Figure 9:
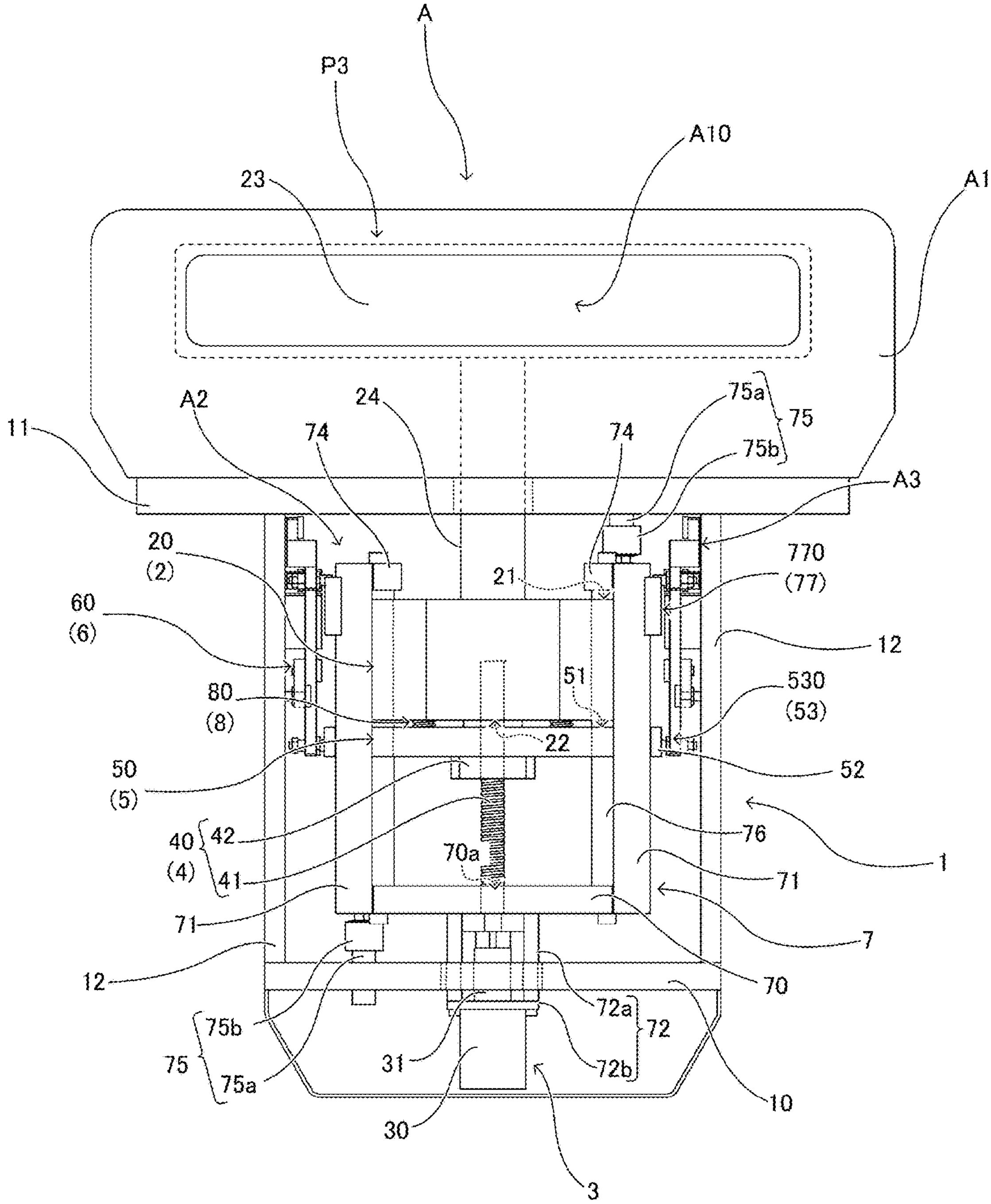
FIG. 9 is a front view illustrating the internal configuration of the gate valve according to one embodiment of the present invention.

In the description made hereinafter, unless otherwise a viewing direction is particularly determined, a closing side where a valve element of the gate valve seals an opening (a left side in FIG. 10) is referred to as a front side or a front surface side, and a side opposite to the front side or the front surface side (a right side in FIG. 10) is referred to as a rear side or a back surface side. Using these sides as the reference, left and right sides in FIG. 9 are referred to as left and right sides, an upper side in FIG. 9 is referred to as an upper side or an upper surface side, and a lower side in FIG. 9 is referred to as a lower side or a bottom surface side.

[1. Overall Configuration of Gate Valve]

Figure 1:
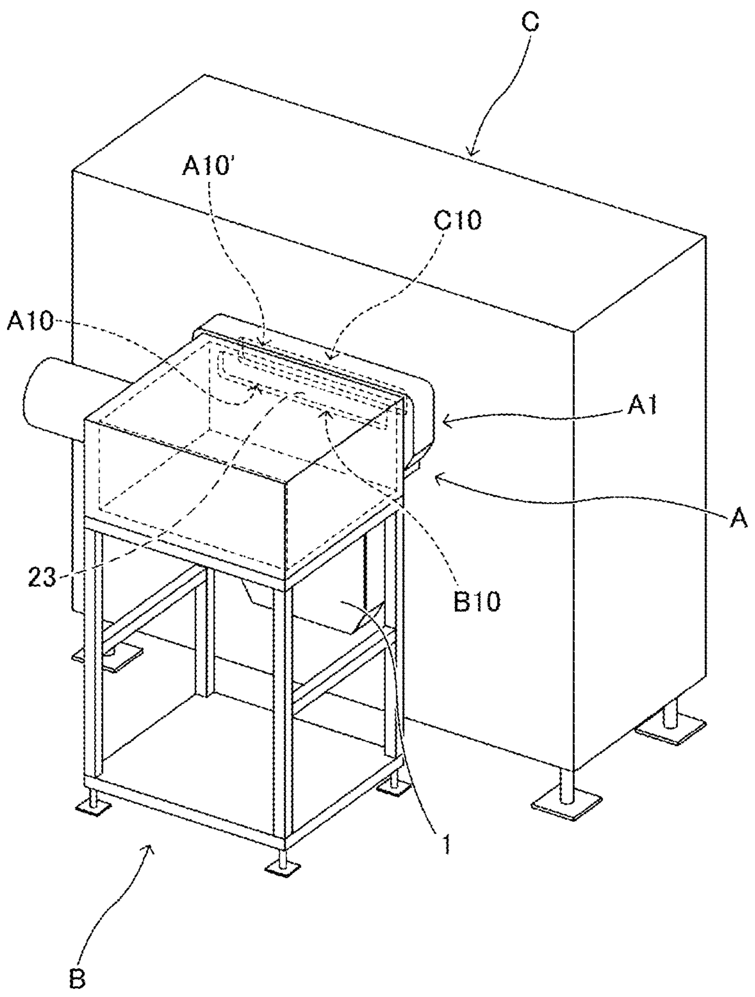
FIG. 1 is a perspective view illustrating the external appearance configuration of a semiconductor manufacturing device provided with a gate valve according to one embodiment of the present invention.

A gate valve A according to the present invention includes a mechanism that performs opening and closing operations of a valve element 23 that is brought into pressure contact with an opening surface A100 of an opening A10 that communicates with a processing unit of a processing device that performs vacuum processing so as to seal the opening A10. As illustrated in FIG. 1, the gate valve A is disposed between processing devices used for manufacturing semiconductors, for example, between a load lock device B that increases a degree of vacuum to a predetermined value and a processing device C that processes a wafer in vacuum.

Figure 2:
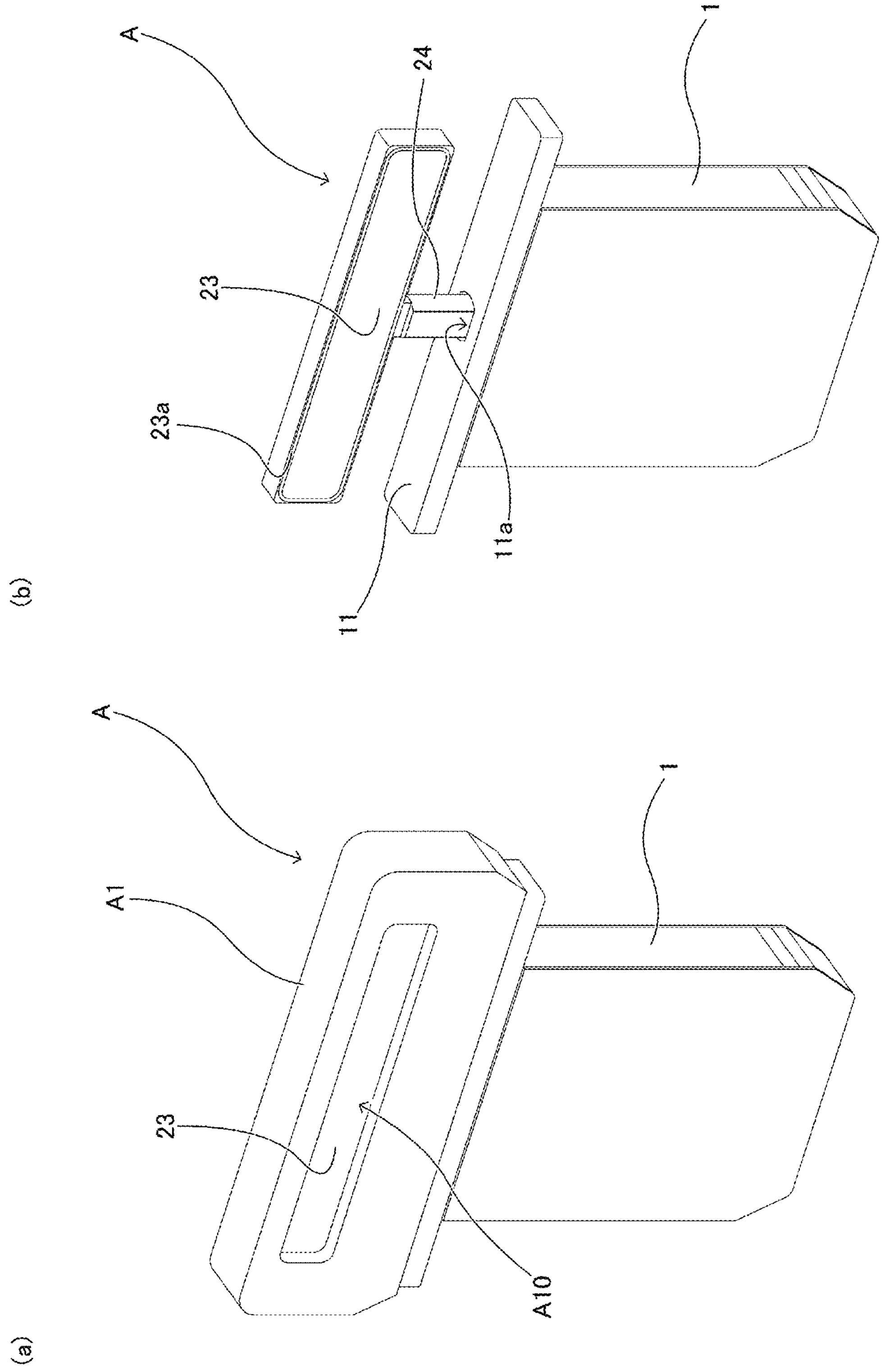
FIG. 2 is a perspective view of the external appearance of the gate valve according to one embodiment of the present invention.

As illustrated in FIG. 1 and FIG. 2(*a*), the gate valve A according to the present embodiment is a so-called angular gate valve that includes: the valve box A1 that houses the valve element 23; and a housing 1 continuously disposed below the valve box A1.

The valve box A1 has openings A10, A10' that communicate with processing units of respective devices B, C corresponding to an opening B10 of the load lock device B and an opening C10 of the processing unit c respectively. The housing 1 houses a valve element operation mechanism that operates the valve element 23 such that the valve element 23 opens or closes the openings A10, A10'.

Figure 14:
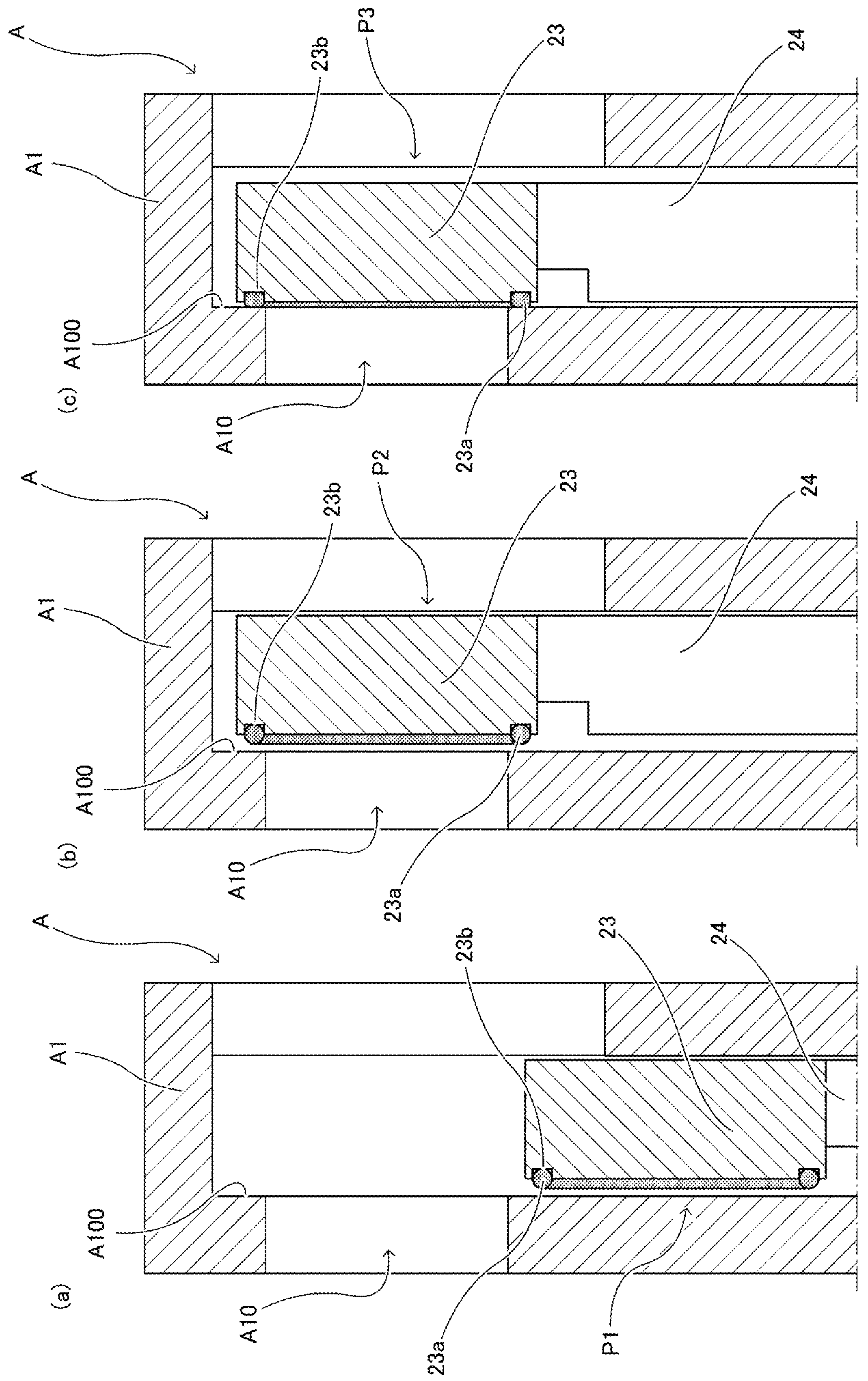
FIG. 14 is a partially enlarged side cross-sectional view illustrating the internal configuration of the gate valve according to one embodiment of the present invention.

The gate valve A moves the valve element 23 toward an opening surface of the opening A10 that forms a loading/unloading opening for a wafer in a perpendicular direction. As illustrated in FIG. 14, a seal member 23*a* that is made of an elastic material provided to the valve element 23 described later is pressed to the opening surface A100 so that the seal member 23*a* is collapsed by pressing. With such a configuration, the opening A10 is sealed. In the gate valve A, as illustrated in FIG. 2(*a*), the opening A10 that communicates with an opening B10 of the load lock device B is formed in the front surface of the valve box A1 in a penetrating manner. The opening A10 is a hole that has a laterally elongated rectangular shape as viewed in a front view.

As illustrated in FIG. 2(*a*), the gate valve A may be a so-called door valve that excludes the valve box A1. In this case, for example, the gate valve A is disposed so as to allow the valve element 23 to approach to or to be separated from by moving the valve element 23 in a direction perpendicular to the opening surface of the opening B10 of the load lock device B and the opening surface of the opening C10 of the processing device C.

The valve element 23 is a plate member having a laterally elongated shape that is slightly larger than the openings A10, B10, C10 and has a similar shape as the openings A10, B10, C10. The valve element 23 sets a plate surface thereof on one side as a contact surface that is brought into contact with an outer peripheral surface that forms opening surfaces of the openings A10, B10, C10. As illustrated in FIG. 2(*b*), FIG. 4 and FIG. 14, the seal member 23*a* made of an elastic material is adhered to the contact surface of the valve element 23.

The seal member 23*a* is an annular (an endless shape) member having a circular transverse cross-sectional shape, for example. As illustrated in FIG. 14(*a*) to FIG. 14(*c*), the seal member 23*a* is disposed in a peripheral groove 23*b* formed on the contact surface of the valve element 23 along an outer periphery of the valve element 23 and protrudes from the contact surface of the valve element 23 toward an opening surface A100 side by a predetermined height. Further, the seal member 23*a* is, at a closing position P3 described later, pressed to the opening surface A100 due to the movement of the valve element 23 in the perpendicular direction, and is collapsed by pressing.

Figure 11:
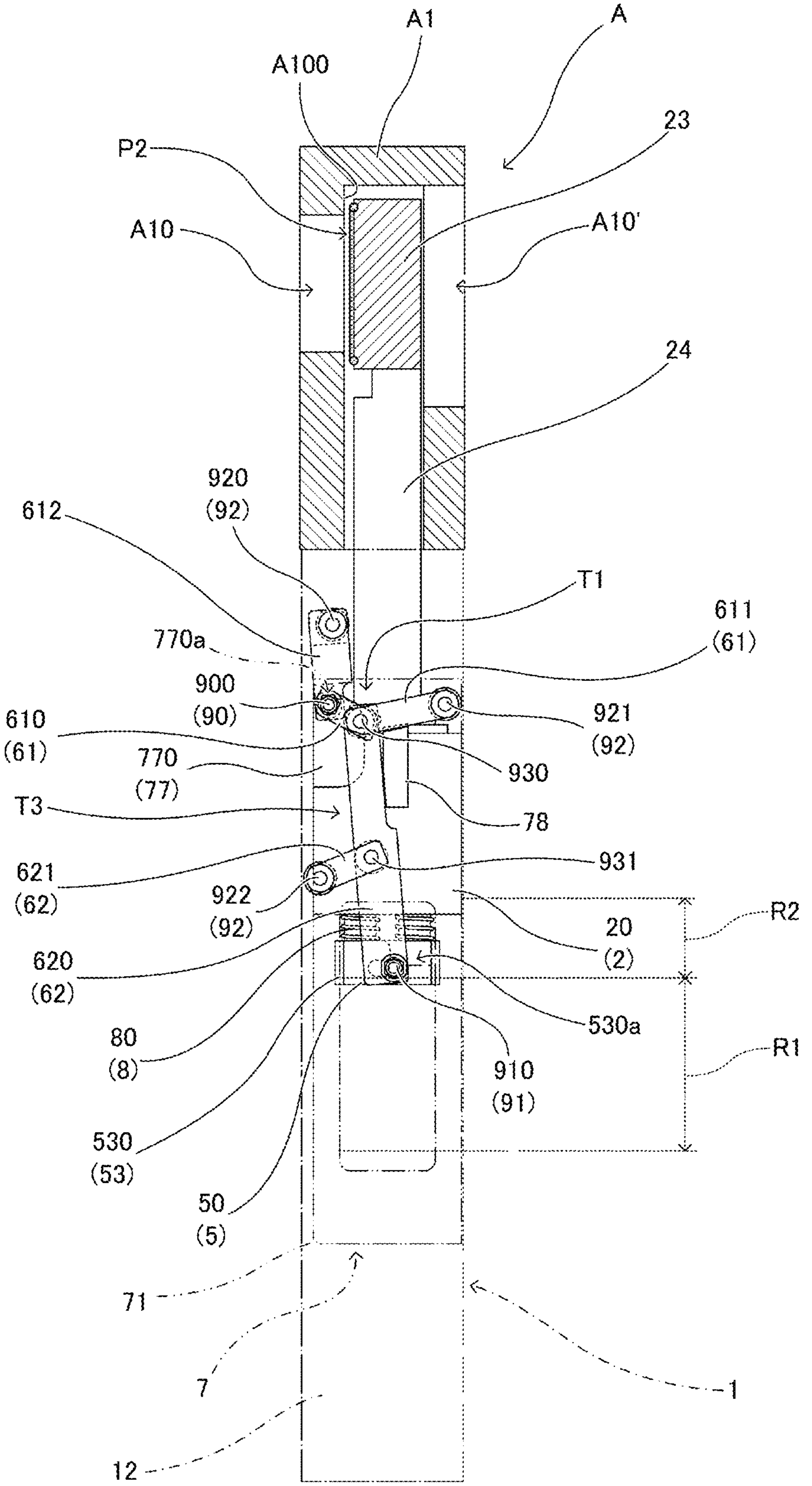
FIG. 11 is a side view illustrating the internal configuration of the gate valve according to one embodiment of the present invention.
Figure 12:
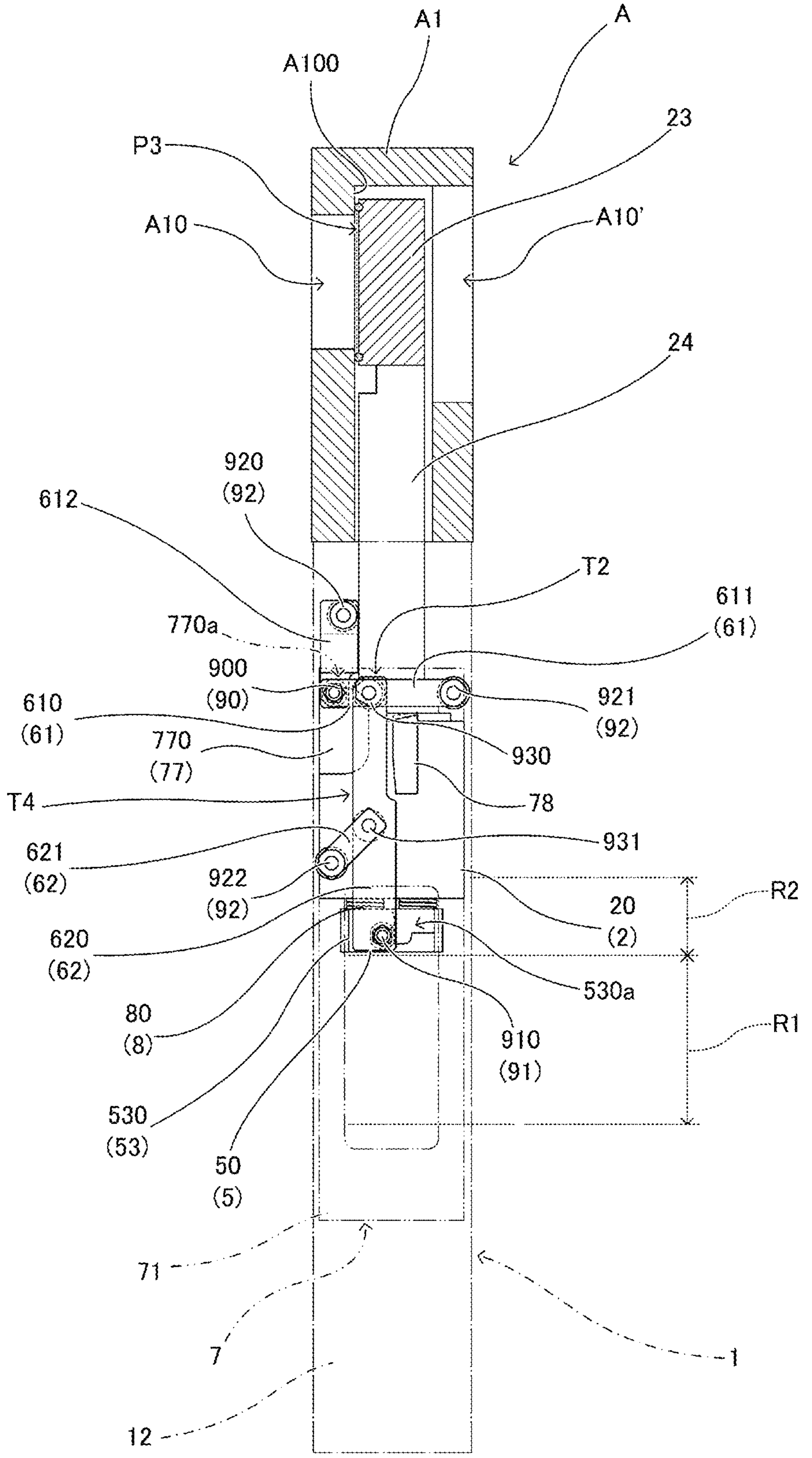
FIG. 12 is a side view illustrating the internal configuration of the gate valve according to one embodiment of the present invention.

In the description described above, the perpendicular direction that the valve element 23 moves is, as illustrated in FIG. 11 to FIG. 12, FIG. 14(*b*) and FIG. 14(*c*), a direction along which the valve element 23 is made to approach to the opening surface A100 or is made to be separated from the opening surface A100 between an opposedly facing position P2 and a closed position P3 described later with respect to an opposedly facing direction of the opening surface A100 while maintain the state that the plate surface of the valve element 23 and the opening surface A100 are held in a parallel surface state. The perpendicular direction that the valve element 23 of the present invention moves is a horizontal direction (longitudinal direction) perpendicular to the opening surface A100 set as the vertical surface.

Figure 10:
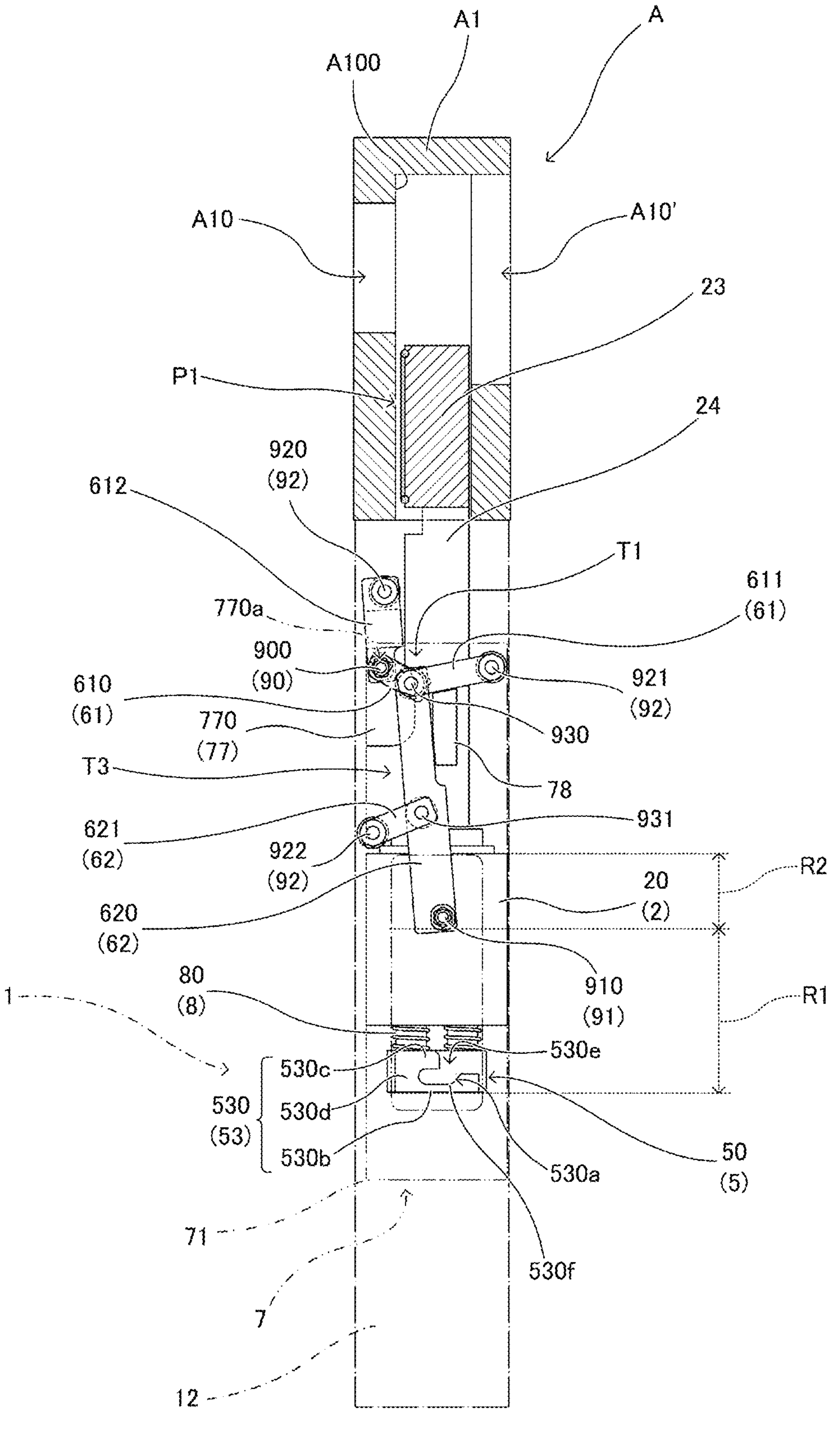
FIG. 10 is a side view illustrating the internal configuration of the gate valve according to one embodiment of the present invention.

Further, an intersecting direction along which the valve element 23 moves is, as illustrated in FIG. 10 to FIG. 11, FIG. 14(*a*) and FIG. 14(*b*), a direction that intersects (crosses) in the above-mentioned perpendicular direction as viewed in a side view of the gate valve A. That is, using the position of the opening A10 of the opening surface A100 as the reference, the intersecting direction (crossing direction) along which the valve element 23 moves is the direction along which the valve element 23 is made to approach to or is made to be separated from the opening surface A100 between the open position P1 and the opposedly facing position P2 described later with respect to the height direction of the opening surface A100. In this embodiment, the intersecting direction along which the valve element 23 moves is the vertical direction (the vertical direction, the direction perpendicular to the horizontal direction) that is parallel to the opening surface A100 set as the vertical surface. However, the intersecting direction along which the valve element 23 moves may be an inclined direction that is inclined with respect to the vertical direction.

The valve element 23 of the gate valve A of the present embodiment moves so as to approach to or be separated from the opening surface A100 or moves while maintaining a fixed distance from the opening surface A100 using the position of the opening surface A100 as the reference. More specifically, the valve element operation mechanism housed in the housing 1 is configured such that the valve element 23 draws a substantially right-angled moving trajectory in a vertical formed of respective directions consisting of the vertical direction and the orthogonal direction that is orthogonal to the vertical direction.

In other words, the closing direction of the valve element 23 that closes the opening A10 is the direction that the valve element 23 approaches the opening surface A100 out of the respective directions consisting of the intersecting direction and the vertical direction. Further, the release direction of the valve element 23 that releases the opening A10 is the direction along which the valve element 23 is separated from the opening surface A100 out of the respective directions consisting of the intersecting direction and the vertical direction.

Figure 3:
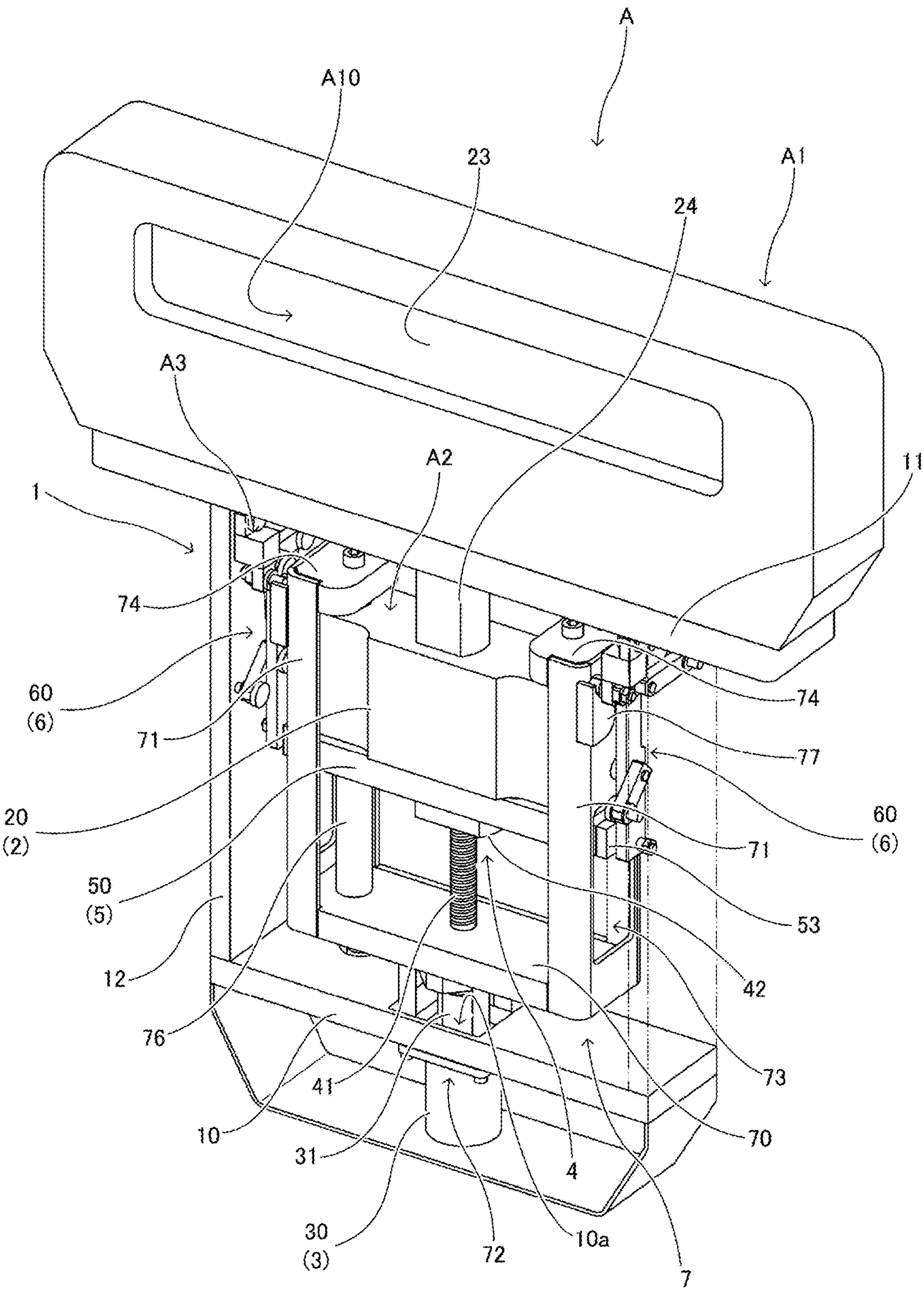
FIG. 3 is a perspective view showing the internal configuration of the gate valve according to one embodiment of the present invention.
Figure 4:
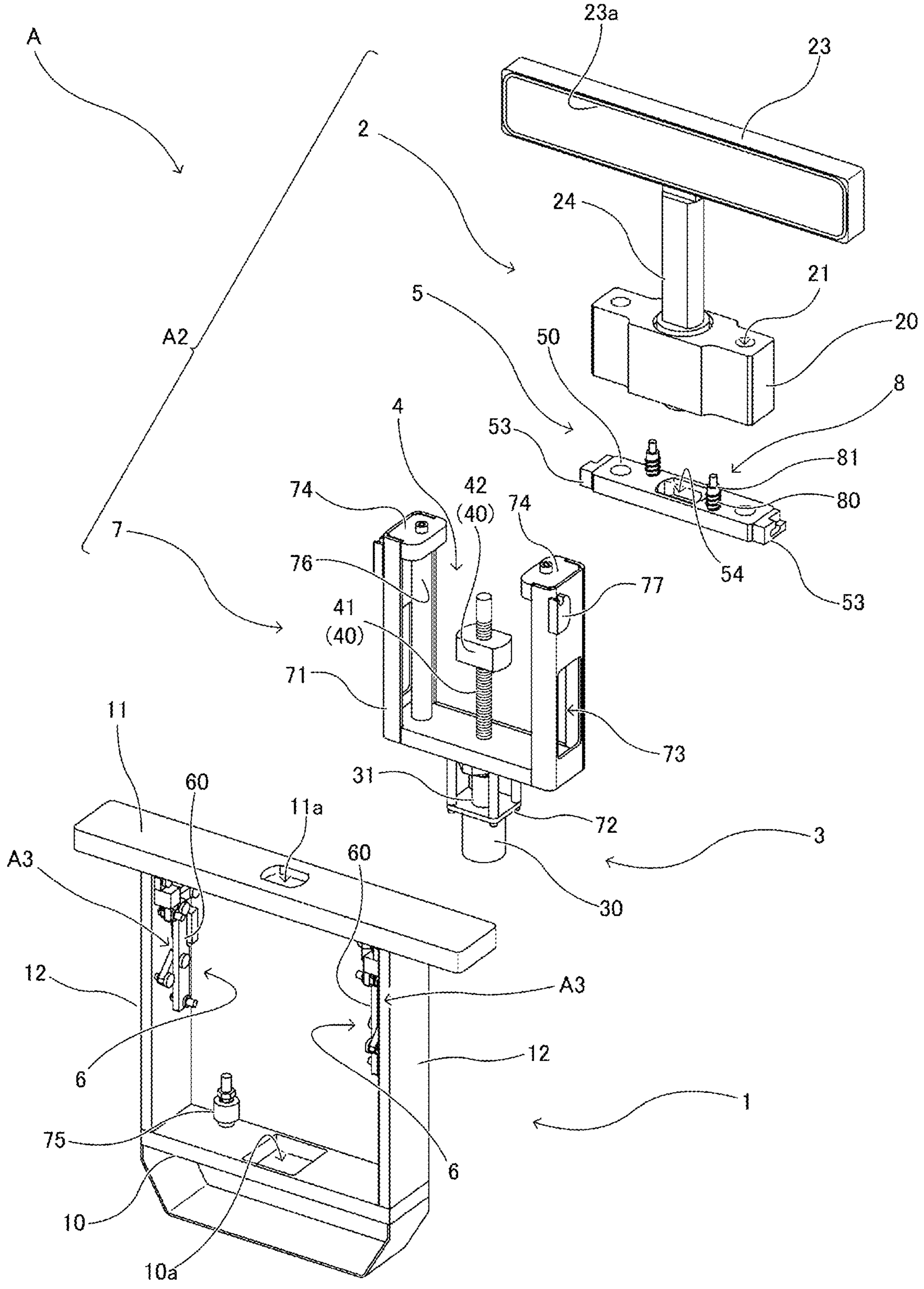
FIG. 4 is an exploded perspective view illustrating the internal configuration of the gate valve according to one embodiment of the present invention.

As illustrated in FIG. 3 and FIG. 4, the housing 1 includes a lower side wall 10, an upper side wall 11, a left side wall 12 and a right side wall 12, and is formed in a rectangular box shape having a hollow inside. In a center portion of the lower side wall 10, a support frame insertion hole 10*a* is formed. The support frame insertion hole 10*a* is formed so as to allow a drive source support frame 72 on which a drive source 3 is formed to pass therethrough. Further, in a center portion of the upper side wall 11 of the housing 1, a shaft insertion hole 11*a* is formed. The shaft insertion hole 11*a* is so as to allow a valve element shaft 24 to which the valve element 23 is continuously mounted to pass therethrough. The shaft insertion hole 11*a* is formed while holding a fixed clearance between the insertion hole 11*a* and the valve element shaft 24 so as to allow the valve element shaft 24 to move in the vertical direction and the intersecting direction.

In the housing 1, the valve element operation mechanism is disposed. The valve element operation mechanism moves the valve element 23 in the respective directions consisting of the vertical direction and the intersecting direction with respecting to the opening surface A100 of the opening A10 by way of the valve element shaft 24.

As illustrated in FIG. 3 to FIG. 6, the gate valve A includes: as the valve element operation mechanism that is housed in the housing 1, a moving body 2 that is integrally operated with the valve element 23; a conversion mechanism that moves the moving body 2 in the respective directions consisting of the direction perpendicular to the opening surface A100 and the intersecting direction that intersects with the perpendicular direction; and a transmission mechanism 4 that transmits power from the drive source 3 to the conversion mechanism.

The conversion mechanism includes: a first operation mechanism 5 that moves in the intersecting direction, and moves the moving body 2 in the intersecting direction; and a second operation mechanism 6 that moves the moving body 2 in the perpendicular direction. It is not always necessary that the conversion mechanism moves the moving body 2 at a right angle. That is, as described previously, the conversion mechanism moves the moving body 2 in the intersecting direction and the perpendicular direction individually by operating the first operation mechanism 5 and the second operation mechanism 6. However, provided that the valve element 23 can be made to approach to or be separated from the opening surface A100 of the opening A10 by way of the moving body 2, even when the trajectory of the moving body 2 that moves intersecting direction and the trajectory of the moving body 2 that moves in the perpendicular direction are not orthogonal, such a configuration does not depart from the technical concept according to the present invention.

The technical feature that should be particularly pointed out with respect to the gate valve A according to the present invention is that the operation performed by the second operation mechanism 6 includes the operation due to the additional movement in the intersecting direction of the first operation mechanism 5 from a state that the movement of the moving body 2 in the intersecting direction is restricted.

The gate valve A where the movement direction of the valve element 23 is set individually and in a stepwise manner by the first operation mechanism 5 and the second operation mechanism 6 includes: a housing 1 where the second operation mechanism 6 is disposed; and a guide member 7 whose movement in the intersecting direction is restricted by the housing 1 and which is disposed movably in a direction perpendicular together with a moving body 2. That is, the second operation mechanism 6 is disposed at the preliminarily fixed position irrespective to the movement of the moving body 2 in the intersecting direction.

Figure 6:
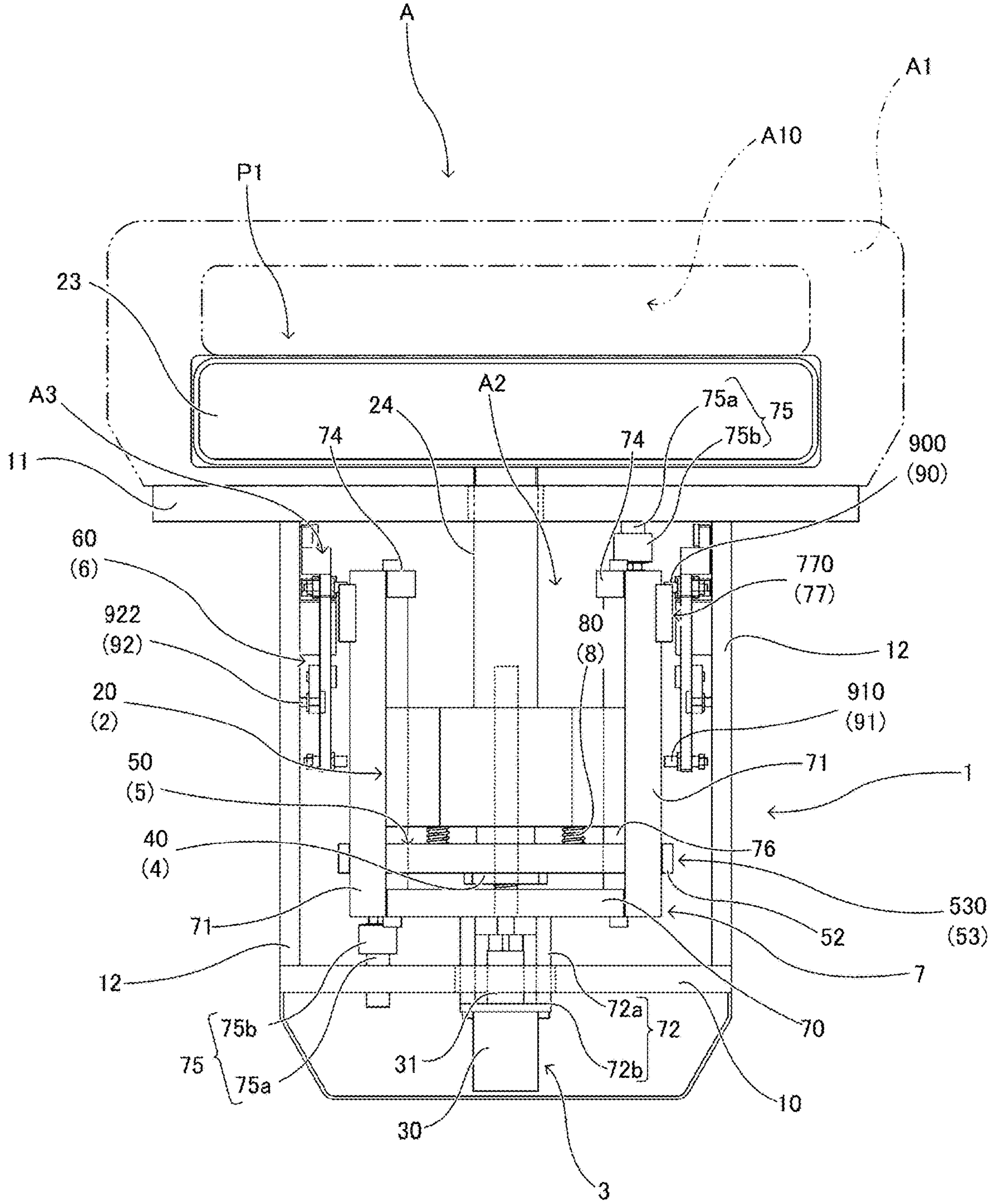
FIG. 6 is a front view illustrating the internal configuration of the gate valve according to one embodiment of the present invention.

As described in FIG. 6, the second operation mechanism 6 includes: support portions 92 that are supported by the housing 1; engaging portions 90 that engage with the guide member 7; and input portions 91 that engage with or disengage from the first operation mechanism 1. The guide member 7 includes first engaging members 77 that engage with the engaging portions 90 of the second operation mechanism 6. The first operation mechanism 5 includes second engaging member 53 that engages with input portions 91 of the second operating members 6.

Particularly, as illustrated in FIG. 10 to FIG. 12, the second operation mechanism 6 according the present embodiment is constituted of a link mechanism 60, and includes a perpendicular link portion 61 that includes an engaging portion 90; and a transmitting link mechanism 62 that includes an input portion 91.

The second operation mechanism 6 converts a force of additional movement in the perpendicular direction of the first operation mechanism 5 that is inputted from the first operation mechanism 5 to the input portion 91 into a moving force in the perpendicular direction by way of the transmitting link portion 62 and the perpendicular link portion 61.

The moving force in the vertical direction converted by the second operation mechanism 6 is transmitted to the guide member 7 by way of the engaging portion 90 of the vertical link portion 61, and the guide member 7 moves in the perpendicular direction together with the moving body 2. Along with the movement of the moving body 2 in the perpendicular direction, the valve element 23 performs an opening/closing operation.

With such a valve body operation mechanism disposed in the housing 1, as illustrated in FIG. 6 and FIG. 8 to FIG. 12, the valve element 23 is configured to be movable between three positions, that is, an open position P1 at which the valve element 23 is housed in a lower portion of the valve box A1, an opposedly facing position P2 at which the valve element 23 faces the opening surface A100 disposed at an upper portion of the valve box A1 and is separated from the opening A10 formed in an upper portion of the valve box A1, and a closed position P3 at which the valve element 23 opposedly faces the opening surface A100 disposed at an upper portion of the valve box A1 and is hermetically brought into contact with a peripheral portion of the opening portion A10. The valve element 23 brings the opening A10 into a closed state when the valve element 23 is positioned at the closed portion P3, and brings the opening A10 into the open position, and when the valve element 23 is positioned at the open portion P1, the opening A10 is brought into an open state.

Further, as illustrated in FIG. 10 to FIG. 12, the first operation mechanism 5, due to the operation in a first operation region R1 and a second operation region R2, moves the moving body 2 integrally with the valve element 23 so as to move the valve body 23 to the open position P1, the opposedly facing position P2 and the closed position P3.

The first operation region R1 is a region where the first operation mechanism 5 performs a first operation of moving the valve element 23 (moving body 2) between the opening position P1 and the opposedly facing position P2. The second operation region R2 is a region where the first operation mechanism 5 performs the second operation of moving the valve element 23 between the opposedly facing position P2 and the closing position P3.

To describe in detail, the first operation region R1 is a region where the first operation mechanism 5 moves in the intersecting direction until the second engaging member 53 that is mounted on a lift member 50 described later as a first operation mechanism 5 is brought into contact with the engaging portion 90 of a second operation mechanism 6. A first operation of the first operation mechanism 5 is an operation that the lift member 50 moves in the first operation region R1, and is an operation that moves the moving body in the intersecting direction. With such a first operation, the valve element 23 that is continuously mounted on the moving body 2 moves back and forth between the open position P1 and the opposedly facing position P2.

The second operation region R2 is a region where the second engaging member 53 that is mounted on the first operation mechanism 5 moves in the intersecting direction while maintaining a state where the second engaging member 53 is in contact with the input portion 91. A second operation of the first operation mechanism 5 is an operation where the first operation mechanism 5 moves in the second operation region R2, and is an operation performed for operating the second operation mechanism 6. With the second operation, the valve element 23 continuously mounted on the moving body 2 moves back and forth between the closed position P3 and the opposedly facing position P2. Although the second operation mechanism 6 moves the moving body 2 in the vertical direction in the second operation, unlike the first operation, the moving body 2 is not moved in the intersecting direction.

That is, the first operation mechanism 5 performs the first operation in the first operation region R1 so as to move the moving body 2 in the intersecting direction thus positioning the valve element 23 at the opposedly facing position P2 from the open position P1 and, thereafter, performs the second operation in the second operation region R2 so as to make the moving body 2 perform an additional movement in an intersecting direction that differs from the intersecting direction in the first operation. Along with the additional movement of the moving body 2 in the intersecting direction as the second operation of the first operation mechanism 5 in the second operation region R2, the second operation mechanism 6 moves the moving body 2 in the perpendicular direction thus positioning the valve element 23 at the closing position P3 from the opposedly facing position P2 whereby hermetic sealing of the opening A10 of the processing unit is realized.

Such a valve element operation mechanism of the gate valve A according to the present embodiment includes, with respect to the opening surface A100 that communicates with the processing unit, two moving mechanism systems consisting of: a valve element intersecting moving mechanism system for adjusting the movement position of the valve element 23 in the intersecting direction; and a valve element perpendicular moving mechanism system for adjusting the movement position of the valve element 23 in the perpendicular direction. Hereinafter, the respective systems are described in detail.

[2. Valve Element Intersecting Moving Mechanism System]

The valve element intersecting moving mechanism system is held in the housing 1, and is constituted of a vertical moving body A2 that includes: the moving body 2 that is movable in the intersecting direction with respect to the opening surface A100; and the first operation mechanism 5. The vertical moving body A2 basically includes the same configuration in left-and-right symmetry as viewed in a front view. Accordingly, hereinafter, the same symbols are given with respect to the same constitutional elements unless otherwise explained and the description of these constitutional elements is omitted.

Figure 8:
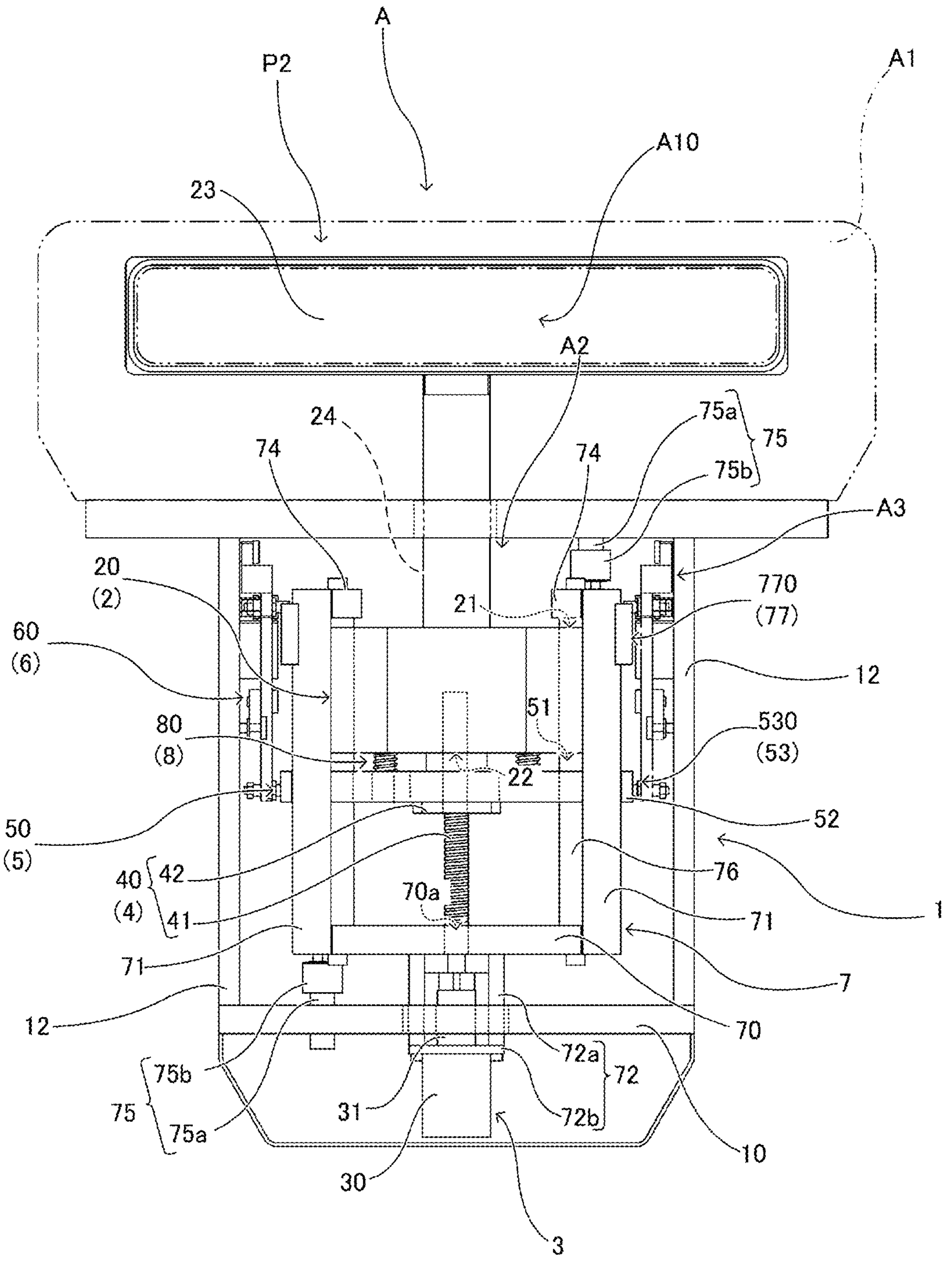
FIG. 8 is a front view illustrating the internal configuration of the gate valve according to one embodiment of the present invention.

As illustrated in FIG. 8, the vertical moving body A2 includes: the moving body 2; the first operation mechanism 5 that moves together with the moving body in the intersecting direction that intersects with the perpendicular direction; the drive source 3 that moves the first operation mechanism 5 in the intersecting direction; the transmission mechanism 4 that transmits power from the drive source 3 to the first operation mechanism 5; a lifting operation mechanism 8 that is disposed between the moving body 2 and the first operation mechanism 5, and moves the moving body 2 in the intersecting direction along with the operation of the first operation mechanism 5; and the guide member 7 that integrally houses these constitutional elements in an integrally movable manner in the perpendicular direction.

The vertical moving body A2 has, in the second operation region R2, a restricting member 74 that restricts the movement of the moving body 2 in the intersecting direction; and the first engaging member 77 that engages with the perpendicular operation mechanism A3 described later.

The guide member 7 functions substantially as a box body that houses a lift slider 20 that forms the moving body 2 and a lift body 50 that forms the first operation mechanism 5 therein and moves the valve element 23 in the intersecting direction. The guide member 7 is a member that is smaller than the housing 1 and a hollow member having an approximately rectangular box shape, and is supported in the housing 1 movably in the perpendicular direction.

The guide member 7 itself does not move in the intersecting direction, and is moved in the perpendicular direction integrally with the valve body 23 (together with the valve body 23) by the perpendicular operation mechanism A3 in the valve element perpendicular movement mechanism system described later. In the valve element intersecting movement mechanism system, the guide member 7 is moved in the vertical direction by the valve element perpendicular movement mechanism system described later and hence, it is safe to say that the valve element perpendicular movement mechanism system is formed of the vertical moving body A2.

The guide member 7 includes: a lower side wall 70; guide rods 76 that are disposed at predetermined positions of the lower side wall 70 and guide the lift slider 20 and the lift body 50 in the intersecting direction; and first engaging members 77 that engage with the engaging portions 90 of the second operation mechanisms 6.

In the present embodiment, the guide member 7 is formed in a U shape that opens upward as viewed in a front view, and has left side wall 71 and the right side wall 71 that form a pair of side walls mounted upright on left and right ends of the lower side wall 70. The left side wall 71 and the right side wall 71 are columnar portions each have a front surface portion, a rear surface portion and side surface portions disposed on left and right outsides, and form a bent-plate-shaped columnar portion having a substantially U shape that opens left and right inner sides thereof by these surface portions. Provided that the left side wall 71 and the right side wall 71 have a function of guiding the moving body 2 and the first operation mechanism 5 in the intersecting direction by the guide rod 76 mounted on the lower side wall 70, neither the left side wall 71 nor the right side wall is an indispensable element. Further, in the present embodiment, a longitudinal hole 73 having a longitudinal rectangular window shape is formed in a lower half portion of the left side wall 71 and a lower portion of the right side wall 71 of the guide member 7 respectively. Left and right end portions of the lift body 50 that forms the first operation mechanism 5 are inserted into the longitudinal holes 73. The longitudinal holes 73 are formed in the left side wall 71 and the right side wall 71 respectively.

A motor 30 that forms the drive source 3 is disposed below the guide member 7. The motor 30 is connected to the transmission mechanism 4 by way of a coupling 31. The transmission mechanism 4 is formed of a so-called ball screw 40 that is constituted of: a screw shaft 41 that includes: an output shaft of the motor 30 by way of the coupling 31; and a ball nut 42 that moves in the intersecting direction along the screw shaft 41. The drive source 3 may be, as another example, a pressurizing device (for example, a pneumatic device, a hydraulic device) that uses a fluid, a linear actuator that uses a magnetic force or the like. Further, it is sufficient that the transmission mechanism 4 be a mechanism that moves the first operation mechanism 5 in the intersecting direction.

Figure 7:
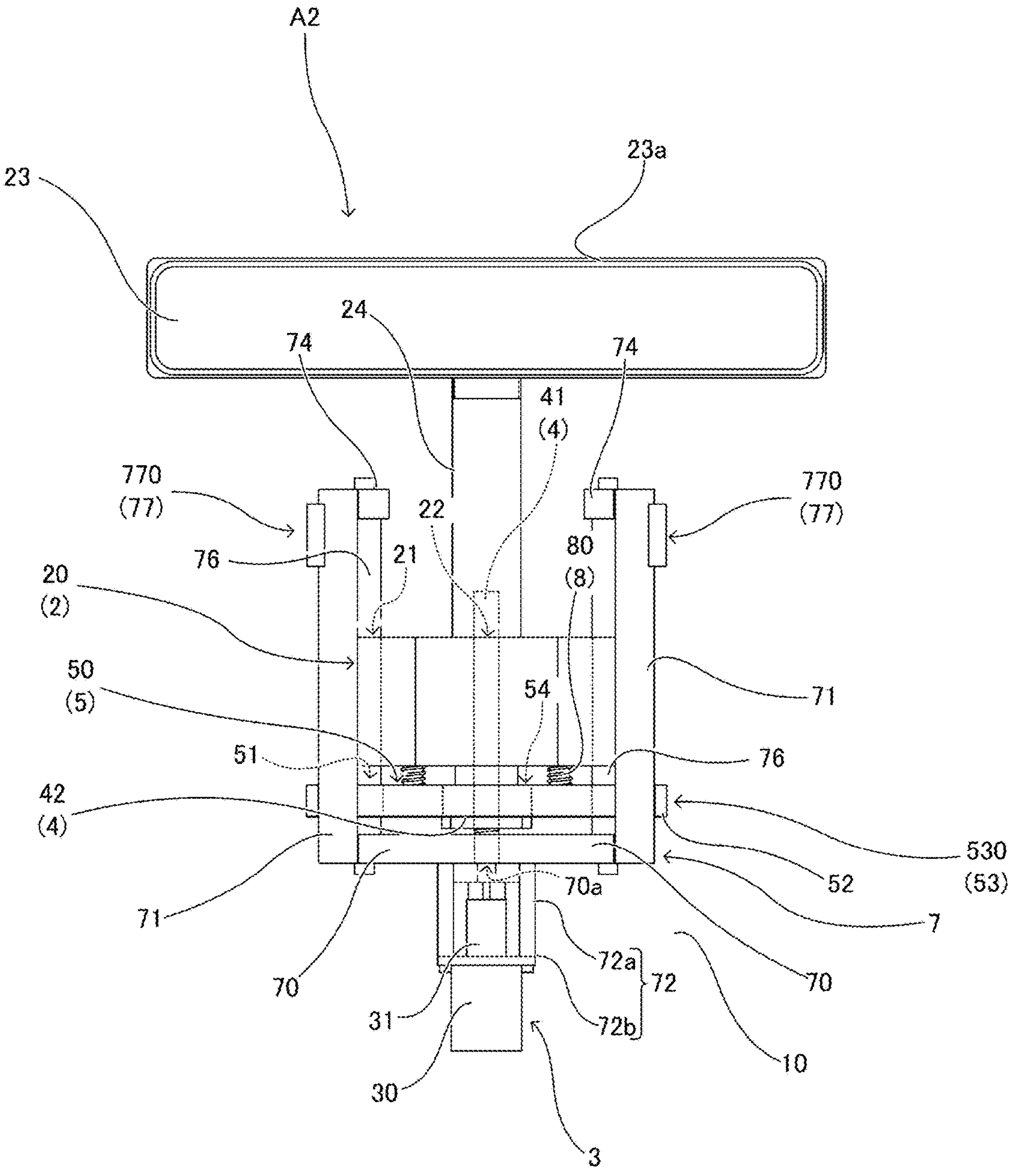
FIG. 7 is a front view illustrating the configuration of a vertical moving body of the gate valve according to one embodiment of the present invention.

As illustrated in FIG. 6 and FIG. 7, the screw shaft 41 is inserted into a through hole 70*a* that is formed in a center portion of a lower side wall 70 of the guide member 7. As illustrated in FIG. 3, the ball nut 42 is movably connected to the screw shaft 41 that protrudes upward into the guide member 7 from the lower side wall 70 through the through hole 70*a* in a state where the ball nut 42 is movable in the intersecting direction (the upper and lower direction). The ball nut 42 is connected to the lift body 50 that forms the first operation mechanism 5, and moves in the intersecting direction integrally with the lift body 50.

A drive source support frame 72 is mounted on a lower peripheral edge portion of the through hole 70*a* formed in the lower side wall 70. The drive source support frame 72 is provided for supporting, in a downwardly extending manner below the guide member 7, the motor 30 having an upwardly directed output shaft and the coupling 31.

As illustrated in FIG. 6 to FIG. 8, the drive source support frame 72 includes: four support pillar frame portions 72*a* that are mounted upright at position that corresponds to four corners of a rectangular shape while holding a fixed distance from a peripheral edge portion of the insertion hole 70*a* on the bottom surface of the lower side wall 70; and a frame base plates 72*b* that are disposed between lower portions of four support pillar frame portions 72*a*. The motor 30 is mounted on a lower surface side of the frame base plate 72*b*, and the coupling 31 is mounted on an upper surface side of the frame support 72*b*.

Further, as illustrated in FIG. 3, at a center portion of the lower side wall 10 of the housing 1, a support frame insertion hole 10*a* is formed. In the inside of the support frame insertion hole 10*a*, the motor 30 and the coupling 31 are disposed together with the drive source support frame 72. The support frame insertion hole 10*a* is formed in a state where a predetermined clearance is held between the support frame insertion hole 10*a* and the drive source support frame 72 so as to allow the drive source support frame 72 to move in the perpendicular direction. In this manner, the drive source 3 is held by the guide member 7 by way of the drive source support frame 72 in a state where the rotation of the drive source 3 is restricted.

The guide rods 76 are members where an upper side of each guide rod 76 passes through the moving body 2 and a lower side of each guide rod 76 passes through the first operation mechanism 5 so as to guide the moving body 2 and the first operation mechanism 5 in the intersecting direction. As illustrated in FIG. 2 and FIG. 3, the guide rods 76 are mounted upright on the lower side wall 70 of the guide member 7. In the present embodiment, the guide rods 76 have substantially the same vertical length as the left side wall 71 and the right side wall 71, and are mounted upright at positions on both left and right sides of the screw shaft 41.

In the lift slider 20 that forms the moving body 2 and the lift body 50 that forms the first operation mechanism 5, guide rod through holes 21, 51 through which the pair of left and right guide rods 76 pass are formed in a penetrating manner. With such a configuration, the movement of the moving body 2 and the movement of the first operation mechanism 5 in the perpendicular direction (the front-rear direction) and in the left-and-right direction are restricted and, at the same time, the rotation of the ball nut 42 accompanying the movement of the ball nut 42 of the ball screw 40 in the intersecting direction is restricted.

Further, in the second operation region R2, the guide rod 76 includes the restricting member 74 that restricts the movement of the moving body in the intersecting direction. The restricting member 74 is fixed to an upper end portion of the guide rod 76.

To be more specific, with respect to the pair of left and right guide rods 76, the restricting member 74 is provided to the guide rod 76 on a left side with respect to the screw shaft 41 and the guide rod 76 on a right side with respect to screw shaft 41 respectively. The restricting member 74 is a member having a rectangular shape as viewed in a plan view, and has an upper surface and a lower surface in a horizontal shape. The restricting members 74 are mounted on an upper end portion of the left side wall 71 and an upper end portion of the right side wall 71 in a mode where the restricting members 74 engage with the respective side walls each having a U-shape as viewed in a plan view. The restricting member 74 on the left side is fixed to an upper end of the left side wall 71 of the guide member 7 and an upper end of the guide rod 76 on a left side, and the restricting member 74 on the right side is fixed to an upper end of the right side wall 71 of the guide member 776 and an upper end of the guide rod on a right side. With such a configuration, the upper surface of the moving body 2 is brought into contact with the lower surface of the restricting member 74 and hence, the position of the moving body 2 in the intersecting direction is defined.

That is, the elevated end position of the moving body 2 whose movement in the intersecting direction (the up-and-down direction or the vertical direction) is restricted by the restricting member 74 takes, as illustrated in FIG. 6 and FIG. 7, the opposedly facing position P2 where the valve element 23 that is continuously mounted on the moving body 2 by way of the valve element shaft 24 protrudes upward in the valve box A1 opposedly faces the opening surface A100.

The first engaging member 77 is mounted on the left and right outer sides of the guide rods 76. In the present embodiment, the first engaging member 77 is provided to outside upper portions of the left side wall 71 and the right side wall 72 close to a front side. However, the first engaging member 77 may be provided to the restricting members 74 mounted on the upper end portions of the guide rods 76.

Figure 5:
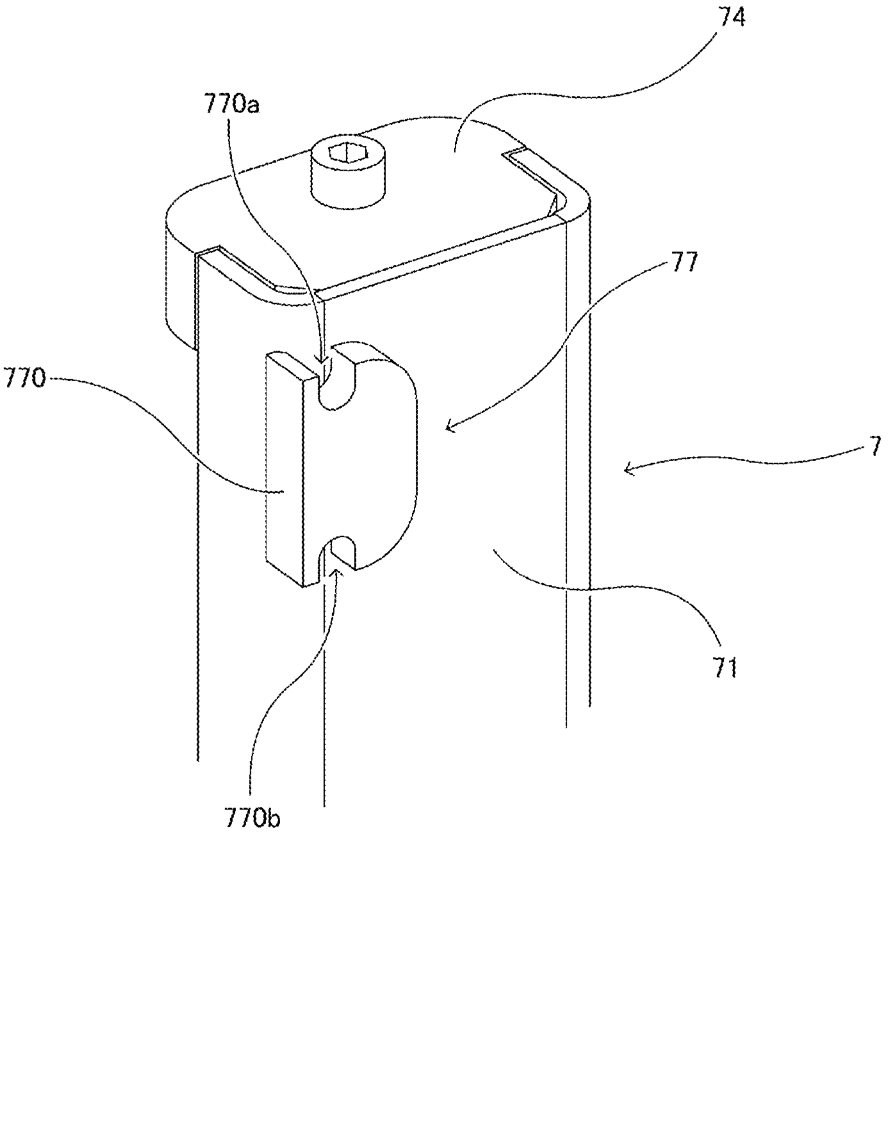
FIG. 5 is a partially enlarged perspective view illustrating the internal configuration of the gate valve according to one embodiment of the present invention.

As illustrated in FIG. 5 and FIG. 10 to FIG. 12, the first engaging member 77 is formed as a first bearing body 770 having a longitudinally elongated groove portion **770*a* whose upper end is opened. In the longitudinally elongated groove portion 770*a*, a first engaging shaft 900 that forms the engaging portion 90 of the second operation mechanism 6 is inserted. As illustrated in FIG. 5, the first bearing body 770 has a longitudinally elongated groove portion 770*b* that is opened downward on a lower side thereof. The longitudinally elongated groove portion 770*b* is formed in vertical symmetry with the longitudinally elongated groove portion 770*a* on an upper side. With such a configuration, when the first bearing body 770 is worn due to its repeated use, by exchanging the left and right first bearing bodies 770 by vertically reversing upside down, the number of frequencies of exchanging the first bearing bodies 770 with new first bearing bodies 770 can be reduced. By exchanging the left and right first bearing bodies 770 by vertically reversing upside down, the first engaging shaft 900 that forms the engaging portion 90 of the second operation mechanism 6 is inserted into the longitudinally elongated groove portion 770*b***.

The first bearing body 770 slidably supports the first engaging shaft 900 that is displaced along with the operation of the link mechanism 60 in the longitudinally elongated groove portion **770*a* in the vertical direction. As illustrated in FIG. 8 to FIG. 10, the left side wall 71 and the right side wall 71 of the guide member 7 are connected to the link restricting member 78 that restricts a swing range of the link body by being brought into contact with a rear end of a prime mover link body 620 of the link mechanism 60** on a rear side of an outside upper portion.

As illustrated in FIG. 6, such a guide member 7 is supported in the housing 1 by an upper side support portion 75 and a lower side support portion 75 movably in the vertical direction from upper and lower sides in a state where the movement of the guide member 7 in the intersecting direction is restricted. The upper side support portion 75 and the lower side support portion 75 have the same configuration respectively, and are disposed on a diagonal line in a portion of the guide member 7 having a rectangular profile as viewed in a plan view.

As illustrated in FIG. 6 and FIG. 7, the upper side support portion 75 is constituted of: a support shaft **75*a* that protrudes from an upper side wall 11 of the housing 1; and a boss 75*b* that protrudes from an upper end portion of the guide member 7 and is fitted on the support shaft 75*a* with a play and moves in the vertical direction about the support shaft 75*a*. In the same manner, the lower side support portion 75 is constituted of: the support shaft 75*a* that protrudes from a lower side wall 10 of the housing 1; and a boss 75*b* that protrudes from a lower end portion of the guide member 7. The vertical moving body A2 is supported on the housing 1 movably in the vertical direction by way of the upper side support portion 75 and the lower side support portion 75**.

Figure 13:
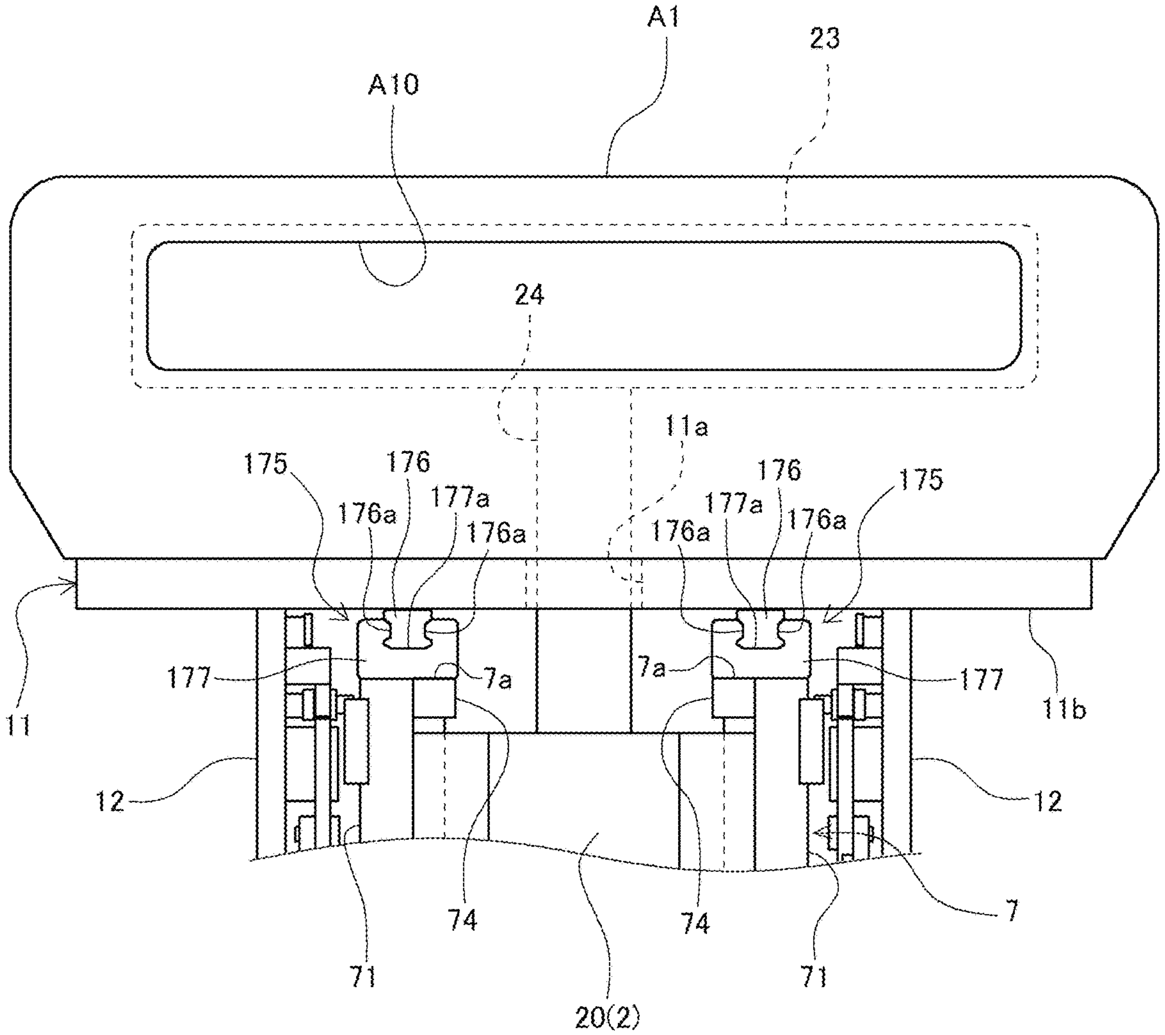
FIG. 13 is a front view illustrating another configurational example with respect to a support configuration of a guide member according to one embodiment of the present invention.

The configuration that supports the guide member 7 in the housing 1 is not limited to the support configuration that uses the upper side support portion 75 and the lower side support portion 75. As the configuration that supports thee guide member 7 in the housing 1, for example, as illustrated in FIG. 13, it may be possible to use the configuration that includes a pair of left and right slide mechanism portions 175. The respective slide mechanism portions 175 are disposed on an upper side of the left and right restricting members 74 that form an upper end portion of the guide member 7.

The slide mechanism portion 175 is configured to have the rail structure where the perpendicular direction is set as the slide direction. The slide mechanism portion 175 includes: a linear guide 176 that is fixed to a lower surface **11*b* of the upper side wall 11 by bolts or the like; and a slider 177 that slidably engages with the linear guide 176. The linear guide 176 extends in the perpendicular direction. The slider 177 is a portion that is fixed to an upper end surface 7*a* (for example, a upper surface of the restricting member 74) by bolts or the like, and moves integrally with the guide member 7**.

The slider 177 is a slide member having a size shorter than the linear guide 176 in the extending direction of the linear guide 176, and has an engaging groove portion **177*a* that engages with a lower portion of the linear guide 176 by fitting engagement. The linear guide 176 has groove portions 176*a* that extend in the slide direction on left and right side surface portions. The slider 177 engages with the linear guide 176 in a state where left and right opening edge portions on an upper side of the engaging groove portion 177***a* engage with the left and right groove portions 176*a* of the linear guide 176. With such an engaging mode between the linear guide 176 and the slider 177, the movement of the slider 177 with respect to the linear guide 176 in the vertical direction, that is, the movement of the guide member 7 in the vertical direction with respect to the upper side wall 11 can be restricted.

In this manner, the guide member 7 may be supported slidably in the housing 1 in the perpendicular direction by the left and right slide mechanism portions 175 with respect to the upper side wall 11 that forms the housing 1. With the support configuration of the guide member 7 that uses the left and right slide mechanism portions 175, the downward movement of the guide member 7 with respect to the upper side wall 11 is restricted and hence, the guide member 7 supported in a downwardly suspended manner with respect to the upper side wall 11 can be realized. Accordingly, as the configuration for supporting the guide member 7, it is unnecessary to use the support portion that is disposed between the guide member 7 and the lower side wall 10 such as the lower side support portion 75 illustrated in FIG. 9 or the like, for example. As the configuration of the slide mechanism portion 175, it may be possible to adopt the configuration upside down with respect to the configuration illustrated in FIG. 13, that is, the configuration where the linear guide 176 is disposed on the upper end surface 7*a* side of the guide member 7, and the slider 177 is disposed on the upper side wall 11 side.

The lift slider 20 that forms the moving body 2 receives a moving force in the perpendicular direction and the intersecting direction with respect to the valve element 23 generated by the first operation mechanism 5 and the second operation mechanism 6, and performs a function of a substantially operation base portion that moves the valve element 23 in the closing direction and the opening direction. The lift slider 20 is a member having a box-shaped profile, and is connected to the valve element 23 by way of the valve element shaft 24. The lift slider 20 is housed in the guide member 7 at a position (an upper position) closer to the valve element 23 than the lift body 50 in the intersecting direction, and is disposed to be guided in the intersecting direction (vertical direction).

At a center portion of the lift slider 20, a screw shaft inserting hole 22 through which the screw shaft 41 passes is formed. As illustrated in FIG. 3 to FIG. 7, a valve element shaft 24 that is connected to the valve element 23 is disposed at a center portion of the lift slider 20 that forms a flat surface and is mounted upright on an upper surface of the lift slider 20. Both left and right portions (upper surfaces of left and right upper corner portions) form contact surface portions that are brought into contact with the restricting members 74.

In the present embodiment, the valve element shaft 24 has the axial direction that is disposed coaxially with the axial direction of the screw shaft 41, and the lift slider 20 is connected to a lower end portion of the valve element shaft 24. With such a configuration, a moving force from the transmission mechanism 4 in the intersecting direction can be transmitted with certainty to the valve element 23 connected to the upper end portion of the valve element shaft 24 and hence, the accurate movement of the valve element 23 can be realized.

The lift body 50 that forms the first operation mechanism 5 performs functions of firstly receiving a moving force of the drive source 3 transmitted from the transmission mechanism 4 in the intersecting direction and, further, transmitting the moving force to the moving body 2 and the second operation mechanism 6. The lift body 50 is configured to be movable in the intersecting direction between a first operation region R1 where the lift body 50 moves in the intersecting direction together with the moving body 2 by way of the lift operation mechanism 8 and a second operation region R2 where the perpendicular operation mechanism described later is operated so that the lift body 50 in the intersecting direction. That is, the lift body 50, as described previously, moves in the intersecting direction along the screw shaft 41 together with the ball nut 42. That is, the lift body 50 moves back and forth between the first operation region R1 and the second operation region R2.

The lift body 50 is a member having a rectangular plate shape, is connected to the lift slider 20 by way of the lift operation mechanism 8, and is connected to the transmission mechanism 4. The lift body 50 is housed in the guide member 7 at the position (the lower position) closer to the drive source 3 than the lift slider 20 in the intersecting direction, and the movement of the lift body 50 in the intersecting direction (the vertical direction) is guided by the guide member 7. The lift body 50 is provided in a state where the lift body 50 is disposed below the lift slider 20 that forms the moving body 2. A ball nut 42 that forms the transmission mechanism 4 housed in the guide member 7 is integrally mounted on the lift body 50.

As illustrated in FIG. 7, a nut fitting engagement hole 54 is formed in a center portion of the lift body 50 in a penetrating manner such that the ball nut 42 that moves in the intersecting direction along the screw shaft 41 engages with the nut fitting engagement hole 54 by fitting engagement. The lift body 50 is configured to integrally move with the ball nut 42 that moves along the screw shaft 41 by fixing the ball nut 42 into the nut fitting engagement hole 54.

Further, as illustrated in FIG. 4 to FIG. 7, the lift body 50 is formed with a left-and-right width slightly longer than a left-and-right width of the lift slider 20. Side end portions 52 of the lift body 50 in the left-and-right direction are positioned outside the left side wall 71 and the right side wall 71 through longitudinal holes 73 formed in lower half portions of the left side wall 71 and the right side wall 71. That is, the left and right side wall portions 52 of the lift body 50 are made to protrude from the longitudinal holes 73 toward the outside on the left and right side of the left side wall 71 and the right side wall 71.

As illustrated in FIG. 7 to FIG. 12, to the side end portions 52 of the lift body 50, a second bearing body 530 that forms the second engaging member 53 is continuously mounted. The second bearing body 530 has a fit-in groove portion 530*a* that receives a second engaging shaft 910 that forms the input part 91 positioned on a lowermost end of the link mechanism 60 therein and guides the second engaging shaft 910.

The second bearing body 530 functions as a so-called cam groove where, with respect to the fit-in groove portion 530*a*, the second engaging shaft 910 that is provided to a lower end of the prime mover link body 620 that is positioned on a lowermost end of the link mechanism 60 is used as a contact element, and the respective link bodies that constitute the link mechanism 60 is used as a cam follower.

As illustrated in FIG. 10, the fit-in groove portion 530*a* is a lateral groove having substantially an L shape as viewed in a side view that is formed on left and right side end surfaces of the lift body 50, and an entrance opening 530*e* is formed in an upper end of one side of the L-shaped path. The entrance opening 530*e* is a portion that receives the second engaging shaft 910 mounted on a lowermost end of the link mechanism 60 described later, and is opened upward.

To be more specific, the second bearing body 530 includes: a lower side groove wall 530*b* that protrudes toward the outside from left and right side end surfaces of the lift body 50 and extends along the front-and-rear direction; an upper side groove wall 530*c* having a short length that extends along the front and rear direction above the lower side groove wall 530*b*; a vertical side groove wall 530*d* that connects front-side end portions of the lower side groove wall 530*b* and the upper side groove wall 530*c*. The vertical side groove wall 530*d* is a portion that connects the lower side groove wall 530*b* and the upper side groove wall 530*c*. In the second bearing body 530, a space portion surrounded by these walls (530*b*, 530*c*, 530*d*) is formed into the fill-in groove portion 530*a* having the entrance opening 530*e* that is opened upward at an upper portion of the rear end. In this manner, the second bearing body 530 has the fit-in groove portion 530*a* that is formed of the lower side groove wall 530*b*, the upper side groove wall 530*c*, and the vertical side groove wall 530*d*, and the fit-in groove portion 530*a* includes the entrance opening 530*a* whose upper side is opened.

A length of the upper side groove wall 530*c* in the front and rear direction is set shorter than a corresponding length of the lower side groove wall 530*b*. When the fit-in groove portion 530*a* is viewed in a vertical direction, a region where the upper side groove wall 530*c* and the lower side groove wall 530*b* do not overlap with each other forms a region where the entrance opening 530*e* is formed.

Further, the second bearing body 530 may further include a guide groove wall 530*f* that is formed upright on a rear side of the lower side groove wall 530*b*. The guide groove wall 530*f* is a curved surface portion having a round (R) shape as viewed in a side view. The guide groove wall 530*f* restricts the movement of the second engaging shaft 910 that enters the fit-in groove portion 530*a* in the rearward direction (the right direction in FIG. 10) and prompts the second engaging shaft 91 to move in the frontward direction (the left direction in FIG. 10).

As illustrated in FIG. 10 and FIG. 11, when the valve element 23 does not seal the opening A, the second engaging shaft 910 is positioned in an overlapping manner with the entrance 530*e* in the vertical direction. In other words, in a state where the lift body 50 is positioned in the first operation region R1, the prime mover link body 620 in the link mechanism 60 makes the input portion 91 opposedly face the entrance opening 530*e*.

The first operation region R1 of the lift body 50 according to the present invention having such a configuration becomes a region on a lower side in a region where the lift body 50 moves in the vertical direction in the axial direction of the screw shaft 41. On the other hand, the second operation region R2 becomes a region on an upper side within a region where the lift body 50 moves in the vertical direction in the axial direction of the screw shaft 41.

To be more specific, the first operation region R1 is a region where the lift body 50 moves in the vertical direction until the second bearing body 530 that forms the second engaging member 53 that is continuously mounted on the lift body 50 is brought into contact with the second engaging shaft 910 that forms the input portion 91. On the other hand, the second operation region R2 is a region where the lift body 50 moves in the vertical direction until the second bearing body 530 that forms the second engaging member 53 that is continuously mounted on the lift body 50 moves in the vertical direction while maintaining a state where the second bearing body 530 is in contact with the second engaging shaft 910 that forms the input portion 91.

Further, the lift operation mechanism 8 is provided between the first operation mechanism 5 and the moving body 2. To be more specific, the lift operation mechanism 8 is formed of resilient bodies 80, and, for example, compression coil springs. A plurality of resilient bodies 80 are disposed between a lower surface of the lift slider 20 and an upper surface of the lift body 50. In other words, as illustrated in FIG. 4 to FIG. 12, the lift slider 20 and the lift body 50 are connected to each other by way of the resilient bodies 80 that form the lift operation mechanism 8.

Two resilient bodies 80 are disposed between the lift slider 20 and the lift body 50 at positions that are in point symmetry with respect to an axis of the screw shaft 41. As illustrated in FIG. 4, the resilient bodies 80 are fitted on guide rods 81 that extend between the lift slider 20 and the lift body 50, and constantly bias the lift slider 20 on the lift body 50. The resilient bodies 80 may be formed of a plurality of disc springs or the like that are exteriorly mounted on the guide rod 81 as another example.

The lift slider 20 and the lift body 50 that are configured as described above are housed in the guide member 7, and move in the upward and downward directions without being rotated together with the ball screw 40 following the threaded rotation of the ball screw 40. That is, in the vertical moving body A2 that forms the valve element intersecting moving mechanism system, as illustrated in FIG. 4 to FIG. 7, along with the driving of the motor 30 that forms the drive source 3, a drive force of the motor 30 is transmitted to the ball screw 40 that forms the transmission mechanism 4.

To be more specific, the screw shaft 41 that is connected to an output shaft of the motor 30 by way of the coupling 31 is rotatably driven, and the threadedly engaged ball nut 42 moves in the vertical direction. Along with the movement of the ball nut 42 in the vertical direction, the lift body 50 that is integrally mounted on the ball nut 42 starts its movement in the vertical direction, and its moving force is transmitted to the lift slider 20 that forms the moving body 2 that is positioned above the lift body 50 by way of the resilient bodies 80 that form the lift operation mechanism 8. That is, the lift body 50 moves in the vertical direction together with the lift slider 20 by the ball screw 40 by way of the resilient bodies 80 held in an extended state.

In this manner, the resilient body 80 is configured to be integrally movable with the lift slider 20 and the lift body 50 in the intersecting direction and in the vertical direction. By adopting such an integrally moving configuration, for example, when the configuration moves in the vertical direction, it is possible to prevent the deformation of the resilient body 80 by buckling. Further, the slide movement at a contact portion between the resilient body 80 and the lift slide 20 and the slide movement at a contact portion between the resilient body 80 and the lift body 50 can be reduced and hence, the generation of particles can be reduced.

When the lift slider 20 abuts against restricting members 74 and stops at an upper lift end position, as illustrated in FIG. 8 and FIG. 11, the valve element 23 protrudes upward in the valve box A1 and takes the opposedly face position P2 where a fixed distance is held between the valve element 23 and the opening A10.

That is, due to the first operation that the lift body 50 performs in the first operation region R1, the lift slider 20 moves back and forth between the open position P1 and the opposedly facing position P2. In other words, the lift slider 20 moves in the vertical direction or in the vertical direction between a state where the lift slider 20 is positioned at a lower side and a state where the lift slider 20 abuts against the restricting members 74.

In this manner, the vertical moving body A2 moves the lift body 50 and the lift slider 20 in the intersecting direction due to the rotary operation of the ball screw 40 thus enabling the operation of the valve element 23 to the upper and lower positions. That is, when the screw shaft 41 that is connected to the output shaft is rotated due to the operation of the motor 30, the lift slider 20 moves along the screw shaft 41 and hence, the valve shaft 24 that is integrally and continuously mounted on the lift slider 20 also moves whereby the movement of the valve element 23 in the intersecting direction for the position adjustment of the valve element 23 is performed. Accordingly, the adjustment of the height of the valve element 23 that makes the valve element 23 accurately correspond to the opening A10 of the valve box A1 is performed.

Further, the lift body 50 performs the second operation in the second operation region R2 and hence, the valve element vertical moving mechanism system described later is operated. Accordingly, the lift slider 20 moves in the perpendicular direction together with the valve element 23 and hence, the valve element 23 moves close to the opening A10 or moves away from the opening A10. This second operation of the lift body 50 becomes an operation of moving the lift body 50 close to or away from the lift slider 20 while deforming the resilient body 80 into an extended state or a shrunken state with respect to the lift slider 20 that is stopped at the upper lift end position.

[3. Valve Element Perpendicular Moving Mechanism System]

Next, the valve element perpendicular moving mechanism system is described in detail. The valve element perpendicular moving mechanism system is constituted by including a perpendicular operation mechanism A3 that is disposed between the housing 1 and the perpendicular moving body A2 in addition to the perpendicular moving body A2 that forms the valve element perpendicular moving mechanism system. The perpendicular operation mechanism A3 basically includes the same configuration in left-and-right line symmetry as viewed in a front view. Accordingly, the description of the configurational elements on both sides is omitted by giving the same symbols to the identical constitutional elements unless otherwise particularly described.

As illustrated in FIG. 9 and FIG. 12, the perpendicular operation mechanism A3 moves the perpendicular moving body A2 in the perpendicular direction along with the second operation of the lift body 50 that forms the first operation mechanism 5 in the second operation region R2, that is, in the intersecting direction.

The perpendicular operation mechanism A3 includes a pair of link mechanisms 60 that is interposed and swings between the housing 1 and the guide members 7 as the above-mentioned second operation mechanism 6. The perpendicular operation mechanism A3 is configured to displace the perpendicular moving body A2 in the perpendicular direction of the housing 1 as a whole, that is, is configured to displace the moving body 2 that includes the valve element 23 in the perpendicular direction together with the guide member 7.

As illustrated in FIG. 10 to FIG. 12, the link mechanism 60 is constituted of a plurality of link bodies that are connected to each other in a relatively rotatable manner. The plurality of link bodies include: a tension link body 611 having one end portion thereof rotatably connected to the housing 1; a follower link body 610 having one end thereof connected to the tension link body 611 in a relatively rotatable manner and having the other end portion thereof engaged with the first engaging member 77; and a prime mover link body 620 having one end portion thereof connected to at least one of the tension link body 611 and the follower link body 610.

The link mechanism 60 moves the moving body 2 from the movement in the intersecting direction to the movement in the perpendicular direction by way of the follower link body 610 and the tension link body 611. More specifically, the link mechanism 60, in the second operation region R2, displaces the prime mover link body 620 by way of the second engaging member 53 of the lift body 50 in the first operation mechanism 5 so that the configuration of the tension link body 611 and the configuration of the follower link body 610 are displaced whereby the moving body 2 is moved in the perpendicular direction.

The configurational displacement of the tension link body 611 and the follower link body 610 in the link mechanism 60 takes, as illustrated in FIG. 10 to FIG. 12, the bent configuration T1 where the tension link body 611 and the follower link body 610 intersect with each other such that the configuration protrudes downward, and the straight line configuration T2 where the tension link body 611 and the follower link body 610 are aligned on a straight line in the perpendicular direction. That is, in the link mechanism 60, the configuration that the tension link body 611 and the follower link body 610 form includes the bent configuration T1 and the straight line configuration T2.

In the bent configuration T1 constituted of the tension link body 611 and the follower link body 610, the valve element 23 is separated from the opening surface A100 so that the opening A10 is brought into an open state. In the straight line configuration T2 formed of the tension link body 611 and the follower link body 610, the valve element 23 is hermetically brought into contact with the opening surface A100 whereby the opening A10 is brought into a closed state.

It is not always necessary that the straight line configuration T2 is a state where the tension link body 611 and the follower link body 610 are aligned in a straight line. For example, provided that the engaging portion 90 (the first engaging shaft 900) is movable in the perpendicular direction, the straight line configuration T2 may be the configuration where the tension link body 611 and the follower link body 610 are slightly bent (including the configuration where the tension link body 611 and the follower link body 610 are slightly bent in a protruding manner toward an upper side and the configuration where the tension link body 611 and the follower link body 610 are slightly bent in a protruding manner toward a lower side). With respect to the straight line configuration T2 where the tension link body 611 and the follower link body 610 are bent in a protruding manner toward the upper side, provided that the movement of the lift body 50 in the intersecting direction is restricted, even when an external force that intends to move the valve element 23 in the perpendicular direction is applied, a closed state of the opening A10 described later is not released.

Such configurational displacements of the tension link body 611 and the follower link body 610 are performed by moving the first operation mechanism 5 in the intersecting direction in the second operation region R2. That is, in the lift body 50, by making the upper side groove wall 530*c* of the second bearing body 530 engage with the prime mover link body 620 in the second operation region R2, the link mechanism 60 is brought into the bent configuration T1, and by making a lower side groove wall 530*b* of the second bearing body 530 engage with the prime mover link body 620 in the second operation region R2, the link mechanism 60 is brought into the straight line configuration T2.

Hereinafter, the configuration of the link mechanism 60 is described in more detail. The plurality of link bodies that constitute the link mechanism 60 are relatively rotatably connected with each other by way of the plurality of swing pivot shafts including the engaging portion 90 and the input portion 91 and, at the same time, the plurality of link bodies are held on the left side wall 12 and the right side wall 12 of the housing 1 by way of the plurality of housing pivot shafts that form support portions 92.

The housing pivot shafts that form the support portions 92 are disposed between the left side wall 12 and the right side wall 12 of the housing 1, and are constituted of three pivot shafts, that is, an upper portion housing pivot shaft 920 that is positioned on an upper portion and a front side, an intermediate housing pivot shaft 921 that is positioned at an intermediate portion and on a rear side, and a lower housing pivot shaft 922 that is positioned on at lower portion and on a front side. In this manner, the support portion 92 is formed of the plurality of housing pivot shafts, and holds the link mechanism 60 that forms the second operation mechanism 6 at positions (portions) predetermined fixed on the left side wall 12 and the right side wall 12 of the housing 1.

The swing pivot shafts that include the engaging portion 90 and the input portion 91 are constituted of four shafts consisting of: the first engaging shaft 900 that moves the lift slider 20 in the perpendicular direction at the position below the upper housing pivot shaft 920; an intermediate swing pivot shaft 930 disposed between the first engaging shaft 900 and the intermediate housing pivot shaft 921; the lower portion swing pivot shaft 931 positioned below the intermediate swing pivot shaft 930 and behind the lower housing pivot shaft 922; and the second engaging shaft 910 positioned at a lowermost end of the link mechanism 60.

That is, the engaging portion 90 is constituted of the first engaging shaft 900 that engages with the first bearing body 770 that forms the first engaging member 77 of the perpendicular moving body A2. Further, the input portion 91 is constituted of the second engaging shaft 910 that engages with the second bearing body 530 that is the second engaging member 53 of the lift body 50 that forms the first operation mechanism 5 of the perpendicular moving body A2.

The follower link body 610 and the tension link body 611 constitute the perpendicular link portion 61 that includes the engaging portion 90 in the link mechanism 60. More specifically, the vertical link portion 61 is constituted of: the follower link body 610 that is interposed between the first engaging shaft 900 at one end portion and the swing pivot shaft at the other end portion; the tension link body 611 that is interposed between the swing pivot shaft at the other end portion of the follower link body 610 and the housing pivot shaft; and the upper swing link body 612 that is interposed between the first engaging shaft 900 at one end portion of the follower link body 610 and the housing pivot shaft at the other end portion of the follower link body 610. That is, the follower link body 610 includes the first engaging shaft 900 at one end portion thereof, and forms such an end portion as the engaging portion 90.

In the link mechanism 60, the prime mover link body 620 constitutes the transmission link portion 62 that includes the input portion 91. More specifically, the transmission link portion 62 is constituted of: the prime mover link body 620 that has one end portion thereof connected to at least the follower link body 610 or the tension link body 611 by way of the swing pivot shaft; and the intermediate swing link body 621 that is interposed between the swing pivot shaft at an intermediate portion of the prime mover link body 620 and the housing pivot shaft at the other end portion of the prime mover link body 620.

The prime mover link body 620 is formed as the input portion 91 that includes the second engaging shaft 910 having the other end portion thereof detachably engaged with the lift body 50, and engages with the lift body 50. As illustrated in FIG. 10, the prime mover link body 620 makes the input portion 91 opposedly face an advancing opening 530*e* in a state where the lift body 50 is positioned in the first operation region R1. The prime mover link body 620 makes the second engaging shaft 910 at an end portion of the prime mover link body 620 engage with the fit-in groove portion 530*a* of the second bearing body 530 of the lift body 50 by fitting engagement.

The second engaging shaft 910 detachably engages with the fit-in groove portion 530*a* of the second bearing body 530 of the lift body 50 protruding from the longitudinal hole 73 of the guide member 7 by fitting engagement.

One end of the prime mover link body 620 is swingably and pivotally supported on the intermediate swing pivot shaft 930 that connects the follower link body 610 and the tension link body 611 to each other. That is, the follower link body 610, the tension link body 611, the prime mover link body 620 are tiltable (rotatable) relative to each other about the common intermediate swing pivot shaft 930.

The prime mover link body 620 is the longest link body in the link mechanism 60. As illustrated in FIG. 10 to FIG. 12, in a state where one end of the prime mover link body 620 is pivotally supported by way of the intermediate swing pivot shaft 930, the prime mover link body 620 is positioned on a side of an upper portion of the longitudinal holes 73 formed in lower half portions of the left side wall 71 and the right side wall 71 of the guide member 7 using the other end of the prime mover link body 620 as the lowermost end of the link mechanism 60.

The prime mover link body 620 pivotally supports the other end of the intermediate swing link body 621 by way of the lower swing pivot shaft 931 mounted on an intermediate portion of the prime mover link body 620.

The intermediate swing link body 621 defines a swinging direction and a swinging range of other link bodies of the link mechanism 60. More specifically, as illustrated in FIG. 10 to FIG. 12, the intermediate swing link body 621 defines the posture of the prime mover link body 620 to an inclined configuration T3 that corresponds to the bent configuration T1 where the opening A10 is opened, and an upright configuration T4 that corresponds to the straight line configuration T2 where the opening A10 is closed and hence, the intermediate swing link body 621 functions as a restricting link that reproduces the bent configuration T1 and the straight line configuration T2 with certainty.

The follower link body 610, the tension link body 611 and the upper swing link body 612 that form the link bodies, the upper housing pivot shaft 920, the intermediate housing pivot shaft 921, the first engaging shaft 900 and the intermediate swing pivot shaft 930 that form the pivot shafts constitute the perpendicular link portion 61 that forms one unit. As illustrated in FIG. 10 to FIG. 12, the perpendicular link portion 61 displace the postures of the follower link body 610 and the tension link body 611 between the bent configuration T1 and the straight line configuration T2 thus allowing the perpendicular moving body A2 to move in the perpendicular direction.

The prime mover link body 620 and the intermediate swing link body 621 that form the link body, and the lower housing pivot shaft 922, the intermediate swing pivot shaft 930, the lower swing pivot shaft 931 and the second engaging shaft 910 that form the pivot shafts constitute the transmission link portion 62 that forms one unit. The transmission link portion 62 transmits an input from the lift body 50 to the perpendicular link portion 61 so as to change the posture of the perpendicular link portion 61.

That is, as illustrated in FIG. 10 to FIG. 12, the perpendicular link portion 61 that is constituted of the follower link body 610 and the tension link body 611 that are connected to each other by way of the intermediate swing pivot shaft 930 is displaced (the configuration is changed) in a straight line shape by a force inputted to the transmission link portion 62 formed of the lower swing pivot shaft 931 that is connected by way of the intermediate swing pivot shaft 930. When the perpendicular link portion 61 is displaced in a straight line shape, the lift slider 20 that is connected to the link mechanism 60 by way of the guide member 7 moves in the perpendicular direction (frontward) together with the guide member 7. By moving the valve element 23 that is continuously mounted on the lift slider 20 in the perpendicular direction together with the movement of the lift slider 20 in the perpendicular direction, the opening A10 is closed by the valve element 23.

In other words, the link mechanism 60 that forms the second operation mechanism 6 holds the bent configuration T1 during the movement in the intersecting direction of the first operation mechanism 5 in the first operation region R1 thus making the valve element 23 separated from the opening surface A100 thus bringing the opening A10 into an open state. With the additional movement of the link mechanism 60 in the intersecting direction against a biassing force of the resilient body 80 of the first operation mechanism 5 in the second operation region, the link mechanism 60 can take the straight line configuration T2 where the valve element 23 is made to approach the opening surface A100 thus bringing the opening A10 into a closed state.

In this manner, in the gate valve A, compared to the valve element operation structure that uses the conventional link mechanism, the link mechanism 60 that forms the second operation mechanism 6 does not move together with the movement of the valve element 23 in the intersecting direction, and the link mechanism 60 is disposed in the housing 1 at the position different from the position of the lift slider 20 that forms the moving body 2 and the position of the lift body 50 that forms the first operation mechanism 5. The link mechanism 60 is disposed in the housing 1 at the preliminarily fixed portion different from the lift body 50 irrelevant to the movement of the moving body 2 in the vertical direction. Accordingly, it is possible to realize the movement of the valve element in the perpendicular direction with the simple assembling and hence, a trouble and damage by friction of the link slide portions can be minimized.

The perpendicular operation mechanism A3 adopts the link mechanism 60 that forms the second operation mechanism 6 as the basic structure. In the link mechanism 60, the follower link body 610 that moves the valve element 23 in the perpendicular direction is connected to the tension link body 611 by way of the intermediate swing pivot shaft 930, and the follower link body 610 is operated by displacing the intermediate swing pivot shaft 930. That is, the perpendicular operation mechanism A3 does not require a complicated link structure and hence, can realize the movement of the valve element 23 in the perpendicular direction with the minimum configuration that establishes the link mechanism.

[4. Closing Operation of Valve Element]

Next, the closing operation of the valve element 23 that closes the opening A10 is described. As illustrated in FIG. 6, FIG. 8, FIG. 10 and FIG. 11, when the lift body 50 is moved in the intersecting direction as the first operation in the first operation region R1, the valve element 23 is positioned to the opposedly facing position P2 from the open position P1.

When the lift body 50 performs the second operation in the second operation region R2, as illustrated in FIG. 11, the second engaging shaft 910 engages with the fit-in groove portion 530*a* by fitting engagement. When the lift body 50 is additionally moved further in the intersecting direction in such a state, as illustrated in FIG. 12, the prime mover link body 620 protrudes the intermediate swing pivot shaft 930 so that the straight line configuration T2 formed of the follower link body 610 and the tension link body 611 appears. That is, the intermediate swing pivot shaft 930 is protruded upward by the prime mover link body 620 and hence, the configuration formed of the follower link body 610 and the protruding link body 611 changed from the bent configuration T1 to the straight line configuration T2.

The displacement of the follower link body 610 and the tension link 611 to the straight line configuration T2 induces the movement of the lift slider 20 in the perpendicular direction by way of the bearing body 770 that receives the first engaging shaft 900 of the follower link body 610, and moves the lift slider 20 in the perpendicular direction together with the guide member 7.

Along with such an operation, as illustrated in FIG. 11 and FIG. 12, the valve element 23 moves in the perpendicular direction from the opposedly facing position P2 to the closed position P3 by way of the valve element shaft 24 that is continuously mounted on the lift slider 20. In this manner, hermetic closing operation of the opening A10 of the gate valve A by the valve element 23 is performed.

More specifically, the lift body 50 that moves in the vertical direction by the ball screw 40 moves the lift slider 20 that is positioned above the slide body 50 until the lift slider 20 is brought into contact with the restricting member 74. During such an operation, the resilient body 80 that connects the lift body 50 and the lift slider 20 is maintained in a substantially extended state. Further, the second engaging shaft 910 that forms the movement input portion 91 is, at the bent configuration T1 of the link mechanism 60, positioned just above the entrance opening 530*e* of the fit-in groove portion 530*a* in the second bearing body 530 that forms the second engaging member 53 on a lower side.

As illustrated in FIG. 10 to FIG. 12, when the lift body 50 moves the lift slider 20 to the restricting member 74 while moving in the intersecting direction in the first operation region R1 as the first operation, the lift body 50 performs the further additional movement in the intersecting direction in the second operation region R2 as the second operation while deforming the resilient body 80 interposed between the lift slider 20 and the lift body 50 against a resilient force of the resilient body.

By performing the second operation of the lift body 50, the fit-in groove portion 530*a* of the second bearing body 530 approaches a lower end of the prime mover link body 620, and the second engaging shaft 910 of the prime mover link body 620 enters the inside of the fit-in groove portion 530*a* from the entrance opening 530*c*.

The second engaging shaft 910 that enters the inside of the fit-in groove portion 530*a* approaches the longitudinal side groove wall 530*d* while being guided by the lower side groove wall 530*b* of the second bearing body 530 and the guide groove wall 530*f* along with the additional movement of the lift body 50. A swing range of the prime mover link body 620 is restricted by the intermediate swing link body 621 and hence, as illustrated in FIG. 11 and FIG. 12, the posture is displaced from the inclined posture T3 to the upright posture T4 corresponding to the movement of the second engaging shaft 910.

Along with such an operation, the follower link body 610 and the tension link body 611 are pushed up by the prime mover link body 620 by way of the intermediate swing pivot shaft 930 and hence, the configuration is changed from the bent configuration T1 where the follower link body 610 and the tension link body 611 protrude toward a lower side to the straight line configuration T2. The first engaging shaft 900 disposed at one end of the follower link body 610 is moved in the perpendicular direction using the intermediate housing pivot shaft 921 disposed at one end of the tension link body 611 as an initiation point.

As a result, the first engaging shaft 900 that moves in the perpendicular direction pushes the front side groove wall of the longitudinally elongated groove portion 770*a* of the first bearing body 770 thus moving the lift slider 20 in the perpendicular direction together with the guide member 7. Accordingly, the valve element 23 that is connected to the lift slider 20 moves in the perpendicular direction to the closed position P3 such that the valve element 23 approaches the opening surface A100 from the opposedly facing position T2 that opposedly faces the opening A10 thus bringing the opening A10 into a closed state as illustrated in FIG. 9 and FIG. 12.

In a closed state where the opening A10 is closed by the valve element 23, the follower link mechanism 610 and the tension link body 611 of the link body 610 are constantly biased upward by the prime mover link body 620 by way of the intermediate swing pivot shaft 930. Accordingly, even when an external force that makes the valve element 23 separated from the opening A10 acts, the straight line configuration T2 is held and, at the same time, a state where the valve element 23 is compressed to the opening A10 is held.

More specifically, the link mechanism 60 functions as a toggle mechanism. The larger an angle that the follower link body 610 that has one end thereof connected to a moving object (for example, the perpendicular moving body A2) and the tension link body 611 that has one end thereof rotatably supported on the housing 1 and the other end thereof connected to the follower link body 611 becomes, the larger an output that moves the perpendicular moving body A2 becomes with respect to a force inputted from the intermediate swing pivot shaft 930.

Even in a case where the link mechanism 60 is operated with a small force, the link mechanism 60 can strongly press the valve element 23 to the opening A10. That is, even when the drive source 3 that has a small output is used, due to an operation of the link mechanism 60, it is possible to strongly press the valve element 23 to the opening A10 and hence, hermetic closing of the opening A10 can be achieved. Accordingly, in the operation of the link mechanism 60, the movement of the valve element 23 in the perpendicular direction can be realized with a small operating force and hence, the energy consumption can be reduced.

Further, in a state where the valve element 23 closes the opening A10, the follower link body 610 and the tension link body 611 take the straight line configuration T2. Accordingly, even in a case where an external force that makes the valve element 23 separated from the opening A10 acts due to an unintended contact or the like, it is possible to maintain a state that the valve element 23 closes the opening A10.

More specifically, when an external force acts on the valve element 23, a force that moves in a perpendicular direction is applied to the first engaging shaft 900 by way of the lift slider 20 that is connected to the valve element 23. However, this force is received by the tension link body 611 having one end thereof connected to the housing 1 by way of the follower link body 610 and hence, the follower link body 610 and the tension link body 611 are not displaced into the bent configuration T1 that protrudes toward a lower side from the straight line configuration T2. Accordingly, a state where the valve element 23 is brought into pressure contact with the opening A10 is held.

That is, without providing a particular locking mechanism, it is possible to realize the valve element locking where the hermetic closing state of the opening A10 by the valve element 23 can be realized by the straight line configuration T2 between the follower link body 610 and the tension link body 611 of the link mechanism 60. Accordingly, it is possible to maintain the sealing state of the opening A1 by the valve element 23 by bringing the follower link body 610 and the tension link body 611 into a straight line shape and hence, energy for maintaining the sealing state is unnecessary thus preventing the wasteful energy consumption.

[Opening Operation of Valve Element]

Next, an opening operation of the valve element 23 for opening the opening A10 is described. As described previously, in a closed state of the opening A10 by the valve element 23, as illustrated in FIG. 8, FIG. 9, FIG. 11 and FIG. 12, along with the additional movement of the lift body 50 in the intersecting direction separated from the valve element 23 in the second operation region R2, the valve element 23 moves from the closed position P3 to the opposedly facing position P2. That is, along with the second operation of the lift body 50, the second engaging shaft 910 of the link mechanism 60 that enters the inside of the fit-in groove portion 530*a* engages with the upper side groove wall 530*c* of the fit-in groove portion 530, and moves downward and rearward and hence, the second engaging shaft 910 is separated from the longitudinal side groove wall 530*d*.

Further, as illustrated in FIG. 11 and FIG. 12, the prime mover link body 620 changes its posture from the upright posture T4 to the inclined posture T3 corresponding to the movement of the second engaging shaft 910. Along with such a change, the follower link body 610 and the tension link body 611 are pulled downward by the prime mover link body 620 by way of the intermediate swing pivot shaft 930. As a result, as illustrated in FIG. 10 and FIG. 11, the link configuration is displaced from the straight line configuration T2 to the bent configuration T1. That is, the intermediate swing pivot shaft 930 is pulled downward by the prime mover link body 620 that changes its posture from the upright posture T4 to the inclined posture T3, the configuration that is formed of the follower link body 610 and the tension link body 611 changes from the straight line configuration T2 to the bent configuration T1. Further, the first engaging shaft 900 disposed at one end of the follower link body 610 moves in the perpendicular direction using the intermediate housing pivot shaft 921 disposed at one end of the tension link body 611 as an initiation point.

As a result, the first engaging shaft 900 that moves in the perpendicular direction presses the rear side groove wall of the longitudinally elongated groove portion 770*a* of the first bearing body 770, and moves the lift slider 20 together with the guide member 7 in the perpendicular direction. Accordingly, the valve element 23 connected to the lift slider 20 moves in the perpendicular direction so as to separate from the opening A10 and hence, the opening A10 is brought into an open state.

Finally, by moving the lift body 50 in the intersecting direction in the first operation region R1 so as to separate the lift body 50 the lift slider 20 from the opening surface 100A in the intersecting direction by way of the resilient body 80, as illustrated in FIG. 6 and FIG. 10, the valve element 23 is positioned from the opposedly facing position P2 to the open position P1 thus bringing the opening A10 into an open state.

In this manner, the gate valve A according to the present embodiment performs a closing operation and an opening operation by the valve element 23 in order of "moving the moving body that forms the valve element intersecting movement mechanism system in the intersecting direction" and "moving the perpendicular moving body A2 in the perpendicular direction by the perpendicular operation mechanism A3 that forms the valve element perpendicular operation mechanism system". That is, the closing operation by the valve element 23 is performed by "approaching movement of the valve element 23 to the opening A10 toward the opening A10 in the intersecting direction", "approaching movement of the valve element 23 toward the opening A10 in the perpendicular direction" and "a closed state of the opening A10". The opening operation of the valve element 23 is performed in order of "separating the valve element 23 from the opening A10 in the perpendicular direction", "separating the valve element 23 from the opening A10 in the intersecting direction" and "an opened state of the opening A1".

Particularly, the link mechanism 60 according to the present invention is configured such that, due to the engaging operation of the prime mover link body 620 and the lift body 50, the follower link body 610 and the tension link body 611 are displaced into the straight line configuration T2 or the bent configuration T1 by way of the intermediate swing pivot shaft 910 so that the movement of the lift slider 20 in the perpendicular direction, that is, the approaching movement or the separation movement of the valve element 23 to the opening A10 of the valve box A1 in the perpendicular direction can be performed.

As has been described above, according to the gate valve A of the present embodiment, due to the combination of simple mechanisms consisting of the perpendicular moving body A2 and the perpendicular operation mechanism A3, the opening A10 of the valve box A1 that communicates with opening B10 of the load lock device B and the opening C10 of the processing device C can be hermetically opened or closed while realizing the stepwise and individual movements of the valve element 23 by neatly dividing the movement in the intersecting direction and the movement in the perpendicular direction and, at the same time, by suppressing a damage on the seal member 23*a* generated by wear.

The above-mentioned mode for carrying out the invention is one embodiment of the present invention, and the present invention is not limited by such a mode for carrying out the present invention. Accordingly, it is needless to say that, even in a case the mode for carrying out the invention differs from the above-mentioned mode for carrying out the invention, provided that such a mode for carrying out the invention does not depart from the scope of the present invention, various modifications are conceivable depending on designs and the like. Further, the advantageous effects described in the present disclosure are merely provided for an exemplifying purpose and are not limitative, and the preset invention can acquire other advantageous effects.

REFERENCE SIGNS LIST

A: gate valve
A1: valve box
A2: perpendicular moving body
A3: perpendicular operating mechanism
1: housing
10: lower side wall
11: upper side wall
12: left side wall or right side wall
2: moving body
20: lift slider
21: guide rod insertion hole
22: screw shaft insertion hole
3: drive source
30: motor
31: coupling
4: transmission mechanism
40: ball screw
41: screw shaft
42: ball nut
5: first operation mechanism
50: lift body
51: guide rod insertion hole
52: side end portion
53: second engaging portion
530: second bearing body
54: nut fitting engagement hole
6: second operation mechanism
60: link mechanism
61: perpendicular link portion
610: follower link body
611: tension link body
612: upper swing link body
62: transmission link portion
620: prime mover link body
621: intermediate swing link body
7: guide member
70: lower side wall
71: left side wall or right side wall
72: drive source support frame
73: longitudinal hole
74: restricting member
75: upper side support portion or lower side support portion
76: guide rod
77: first engaging member
770: first bearing body
8: lift operation mechanism
80: resilient body
81: guide rod
90: engaging portion
91: first engaging shaft
910: second engaging shaft
92: support portion
920: upper housing pivot shaft
921: intermediate housing pivot shaft
922: lower housing pivot shaft
930: intermediate swing pivot shaft
931: lower swing pivot shaft

The invention claimed is:

1. A gate valve configured to press a valve element that includes a seal member to an opening surface where an opening that communicates with a processing part of a processing device that performs processing in vacuum thus sealing the opening, the gate valve comprising:

a moving body configured to move integrally with the valve element;

a conversion mechanism configured to move the moving body in respective directions consisting of a perpendicular direction to the opening surface and an intersecting direction that intersects with the perpendicular direction; and a transmission mechanism configured to transmit power to the conversion mechanism from a drive source, wherein the conversion mechanism includes:

a first operation mechanism configured to move in the intersecting direction so as to make the moving body move in the intersecting direction; and a second operation mechanism configured to make the moving body move in the perpendicular direction, and an operation performed by the second operation mechanism includes an operation due to additional movement of the first operation mechanism in the intersecting direction from a state where the movement of the moving body in the intersecting direction is restricted, the gate valve includes: a housing in which the second operation mechanism is disposed; and a guide member whose movement in the intersecting direction is restricted by housing, the guide member being configured to be movable in the perpendicular direction together with the moving body, and the second operation mechanism includes:

a support portion configured to be supported the housing;

an engaging portion configured to engage with the guide member; and an input portion configured to engage with or to disengage from the first operation mechanism.

2. The gate valve according to claim 1, wherein the second operation mechanism is disposed at a preliminarily fixed position irrelevant to movement of the moving body in the intersecting direction.

3. The gate valve according to claim 1, wherein the second operation mechanism is a link mechanism that includes: a perpendicular link portion that includes the engaging portion; and a transmission link portion that includes the input portion, and the transmission link portion is configured to transmit a force that is inputted to the input portion from the first operation mechanism.

4. The gate valve according to claim 3, wherein the moving body is mounted on the guide member in a state where the moving body is movable in a vertical direction that forms the intersecting direction, the first operation mechanism is constituted of a lift body that is configured to make the moving body move to the vertical direction in the guide member, the link mechanism that forms the second operation mechanism is configured to make the moving body move in the perpendicular direction together with the guide member, and the link mechanism is disposed at a preliminarily fixed another position that differs from the lift body irrelevant to movement of the moving body in the vertical direction.

5. The gate valve according to claim 4, wherein the link mechanism includes a swing pivot shaft that connects a plurality of link bodies in a relatively rotatable manner, the link mechanism includes, as the support portion, a plurality of housing pivot shafts that are pivotally supported on the housing, the link mechanism includes a first engaging shaft configured to engage with the guide member, the link mechanism includes, as the perpendicular link portion, a follower link body that is interposed between the first engaging shaft at one end portion and a swing pivot shaft at an other end portion, and a tension link body that is interposed between the swing pivot shaft at another end portion of the follower link body and the housing pivot shaft, and the link mechanism includes, as the transmission link portion, a prime mover link body that is connected to at least the follower link body or the tension link body at one end portion thereof by way of a swing pivot shaft, and the prime mover link body includes, as the input portion, a second engaging shaft that is configured to engage with or disengage from the lift body at an other end portion thereof, and is configured to engage with the lift body and to follow additional movement of the lift body in the vertical direction.

6. The gate valve according to claim 5, wherein the link mechanism is configured to move the moving body from movement in the intersecting direction to movement in the perpendicular direction by way of the follower link body and the tension link body.

7. A gate valve configured to press a valve element that includes a seal member to an opening surface where an opening that communicates with a processing part of a processing device that performs processing in vacuum thus sealing the opening, the gate valve comprising:

a housing;

a perpendicular moving body being held in the housing and being movable in a perpendicular direction to the opening surface; and a perpendicular operation mechanism disposed between the housing and the perpendicular moving body, the perpendicular moving body includes:

a moving body configured to move integrally with the valve element;

a lift body configured to move together with the moving body in an intersecting direction that intersects with the perpendicular direction;

a drive source configured to make the lift body move in the intersecting direction, and a lift operation mechanism disposed between the lift body and the moving body, the lift body is configured to be movable in the intersecting direction between a first operation region where the lift body moves in the intersecting direction together with the moving body by way of the lift operation mechanism and a second operation region where, in a state where the movement of the moving body in the intersecting direction is restricted, the lift body is further moved in the intersecting direction by operating the perpendicular operation mechanism, and the perpendicular operation mechanism is configured, along with the movement of the lift body in the intersecting direction in the second operation region, the perpendicular moving body is further moved in the perpendicular direction, the perpendicular moving body includes:

a restricting member configured to restrict movement of the moving body in the intersecting direction in the second operation region; and a first engaging member configured to engage with the perpendicular operation mechanism, the perpendicular operation mechanism is a link mechanism, and includes:

a tension link body having one end portion thereof rotatably and pivotally connected to the housing;

a follower link body having one end portion thereof relatively rotatably connected to the tension link body and having an other end thereof engage with the first engaging member; and a prime mover link body having one end portion thereof connected to at least either one of the tension link body and the follower link body, the lift body includes a second engaging member configured to engage with the prime mover link body, and the link mechanism is configured to perform, in the second operation region, configuration displacement between the tension link body and the follower link body by displacing the prime mover link body by way of the second engaging member.

8. The gate valve according to claim 7, wherein the configuration displacement between the tension link body and the follower link body in the link mechanism includes two configurations consisting of:

a bending configuration where the tension link body and the follower link body intersect with each other such that the bent configuration protrudes downward; and a straight line configuration where the tension link body and the follower link body are aligned in a straight line in the perpendicular direction, and the moving body is, in a state of the bent configuration of the link mechanism, to separate the valve element from the opening surface so as to bring the opening into an open state, and the moving body is configured, in the straight line configuration of the link mechanism, the moving body brings the valve element into hermetic contact with the opening surface thus bringing the opening into a closed state.

9. The gate valve according to claim 8, wherein the second engaging member includes a fit-in groove portion that is formed of: a lower side groove wall extending along the perpendicular direction; an upper side groove wall extending along the perpendicular direction and having a shorter length than the lower side groove wall; and a longitudinal side groove wall configured to connect the lower side groove wall and the upper side groove wall, the fit-in groove portion includes an entrance opening having an opening on an upper side;

the lift body is configured to, in the second operation region, to make the upper side groove wall engage with the prime mover link body thus bringing the link mechanism into the bent configuration, and to make the lower side groove wall engage with the prime mover link body so as to bring the link mechanism into the straight line configuration.

10. The gate valve according to claim 9, wherein the prime mover link body includes an input portion that engages with or disengages from the second engaging member at an other end portion thereof, the prime mover link body makes the input portion opposedly face the entrance opening in a state where the lift body is positioned in the first operation region.

* * * * *